(12) United States Patent
Bronstein et al.

(10) Patent No.: US 10,547,005 B2
(45) Date of Patent: Jan. 28, 2020

(54) ORGANIC SEMICONDUCTOR POLYMERS

(71) Applicants: Hugo Bronstein, London (GB);
Mohammed Al-Hashimi, Doha (QA);
Tobin J. Marks, Evanston, IL (US);
Kealan Fallon, London (GB)

(72) Inventors: Hugo Bronstein, London (GB);
Mohammed Al-Hashimi, Doha (QA);
Tobin J. Marks, Evanston, IL (US);
Kealan Fallon, London (GB)

(73) Assignee: Qatar Foundation for Education, Science and Community Development, Doha (QA)

( * ) Notice: Subject to any disclaimer, the term of this patent is extended or adjusted under 35 U.S.C. 154(b) by 0 days.

(21) Appl. No.: 15/457,983

(22) Filed: Mar. 13, 2017

(65) Prior Publication Data
US 2018/0287066 A1    Oct. 4, 2018

Related U.S. Application Data

(60) Provisional application No. 62/331,412, filed on May 3, 2016, provisional application No. 62/307,345, filed on Mar. 11, 2016.

(51) Int. Cl.
| | |
|---|---|
| *H01L 51/00* | (2006.01) |
| *C08G 61/12* | (2006.01) |
| *C09B 57/00* | (2006.01) |
| *H01L 51/42* | (2006.01) |
| *C08G 75/32* | (2006.01) |

(Continued)

(52) U.S. Cl.
CPC ........ *H01L 51/0036* (2013.01); *C08G 61/126* (2013.01); *C09B 57/00* (2013.01); *H01L 51/0043* (2013.01); *C08G 2261/124* (2013.01); *C08G 2261/1412* (2013.01); *C08G 2261/1424* (2013.01); *C08G 2261/18* (2013.01); *C08G 2261/228* (2013.01); *C08G 2261/3223* (2013.01); *C08G 2261/3241* (2013.01); *C08G 2261/514* (2013.01); *C08G 2261/54* (2013.01); *C08G 2261/91* (2013.01);

(Continued)

(58) Field of Classification Search
CPC ................................................. H01L 51/0036
USPC .................................................. 528/375, 377
See application file for complete search history.

(56) References Cited

PUBLICATIONS

Fallon et al; A nature-inspired conjugated polymer for high performance transistors and solor cells; Macromolecules (Wshington DC, USA)), 2015, 48(15), 5148-5154; Chem Abstract 163: 234233 (15457983 586048 EICSearch) (Year: 2015).*

(Continued)

*Primary Examiner* — Duc Truong
(74) *Attorney, Agent, or Firm* — Richard C. Litman; Nath, Goldberg & Meyer

(57) ABSTRACT

The organic semiconductor polymers relate to polymers containing an indolo-naphthyridine-6,13-dione thiophene (INDT) chromophore. The organic semiconductor polymers are formed by polymerizing INDT monomer with thiophene to obtain a conjugated polymer of the chromophore linked by thiophene monomers (INDT-T), with phenyl to obtain a conjugated polymer of the chromophore linked by phenyl monomers (INDT-P), with selenophene to obtain a conjugated polymer of the chromophore linked by selenophene monomers (INDT-S), or with benzothiadazole to obtain a conjugated polymer of the chromophore linked by benzothiadazole monomers (INDT-BT).

3 Claims, 13 Drawing Sheets

(51) Int. Cl.
 *C08G 79/00* (2006.01)
 *H01L 51/05* (2006.01)
(52) U.S. Cl.
 CPC ...... *C08G 2261/92* (2013.01); *H01L 51/0558* (2013.01); *H01L 51/42* (2013.01)

(56) References Cited

PUBLICATIONS

He, B. et al., "New Form of an Old Natural Dye: Bay-Annulated Indigo (BAI) as an Excellent Electron Accepting Unit for High Performance Organic Semiconductors," 42 J. Am. Chem. Soc. 15093-15101, 2014.
Bronstein, H. et al., "Thieno[3,2-b]thiophene-Diketopyrrolopyrrole-Containing Polymers for High-Performance Organic Field-Effect Transistors and Organic Photovoltaic Devices," 10 J. Am. Chem. Soc. 3272-3275, 2011.

\* cited by examiner

ORGANIC SEMICONDUCTOR POLYMERS

CROSS-REFERENCE TO RELATED APPLICATION

This application claims the benefit of U.S. Provisional Patent Application Ser. No. 62/331,412, filed May 3, 2016, and U.S. Provisional Patent Application Ser. No. 62/307,345, filed Mar. 11, 2016.

BACKGROUND OF THE INVENTION

1. Field of the Invention

The present invention relates to organic semiconductor polymers, and particularly to polymers including an indolo-naphthyridine-6,13-dione thiophene (INDT) chromophore.

2. Description of the Related Art

Recent rapid advances in organic field effect transistors (OFETs) and organic photovoltaics (OPVs) have been propelled primarily by the design, characterization, and understanding of novel conjugated polymers. Small chemical modifications to monomers or building blocks can have major consequences for bulk device transport and photovoltaic efficiency by mechanisms which are incompletely understood. Similarly, there has been much interest in the effects of various co-monomer arrays of donor-acceptor (DA) copolymers. Understanding structure-property relationships of conjugated systems is crucial for targeted design of the next generation of high performance organic semiconductors.

Power conversion efficiencies (PCEs) in OPV devices have been climbing steadily in the past few years and efficiencies exceeding 10% for single-junction and tandem OPVs have been reported. OFET devices aim for hole ($\mu$h) and electron ($\mu$e) field-effect mobilities above the benchmark of amorphous silicon (1 cm2 Vs−1) in order to compete with their inorganic counterparts and mobilities above this benchmark are considered 'ultra-high'.

There is extensive literature on p-type organic polymers with hole transport $\mu$h>1 cm2 Vs−1. Indeed, many well-known structural motifs including polythiophene, cyclopentadithiophene (CPDT), diketopyrrolopyrrole (DPP), isoindigo (iI), and indacenodithiophene have all displayed ultra-high hole transport in OFETs. Moreover, structural studies reveal that OFET hole mobility is less dependent on long-range structural order in thin-films, however it is highly dependent on the presence of rigid, extended high-molecular-weight polymer chains allowing charge transport to occur along the polymer backbone and vastly improving interconnectivity between disordered regions.

As polymer synthesis has steadily improved to afford higher molecular weight polymers which contain planar monomers, it is perhaps unsurprising that most organic structural motifs available to the polymer chemist facilitate high p-type transport. Recently, state-of-the-art p-type organic polymers have reached $\mu$h>10 cm2 Vs−1, approaching the mobility of amorphous metal oxide transistors.

In stark contrast, there are very few examples of OFET devices with ultra-high electron mobility. To the best of our knowledge, all organic polymers displaying n-type mobility $\mu$e>1 cm2 Vs−1 have a polymer backbone based on DPP or naphthalene diimide structures. Zhao et al. provide an excellent review of the advances in n-type OFET materials.

The exact reasoning behind high electron transport in OFETs remains a debate in the field, however it is widely agreed that the energy of the lowest unoccupied molecular orbital (LUMO) plays a crucial role, since polymers must exhibit high electron affinities to facilitate charge injection. Strong intermolecular orbital overlap of polymer strands in thin-film and high ambient stability are also vital requirements for both electron and hole transport. Narrow band gap (Eg) conjugated polymers, $1.1 \leq Eg \leq 2.1$ eV have especially low lying LUMO energies making them excellent candidates for n-type OFET materials. They also display optical absorption in the near-IR region of the electromagnetic spectrum, ideal for both tandem and transparent OPV devices.

Thus, organic semiconductor polymers solving the aforementioned problems are desired.

SUMMARY OF THE INVENTION

The organic semiconductor polymers relate to polymers containing an indolo-naphthyridine-6,13-dione thiophene (INDT) chromophore. The organic semiconductor polymers are formed by polymerizing INDT monomer with thiophene to obtain a conjugated polymer of the chromophore linked by thiophene monomers (INDT-T), with phenyl to obtain a conjugated polymer of the chromophore linked by phenyl monomers (INDT-P), with selenophene to obtain a conjugated polymer of the chromophore linked by selenophene monomers (INDT-S), or with benzothiadazole to obtain a conjugated polymer of the chromophore linked by benzothiadazole monomers (INDT-BT).

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
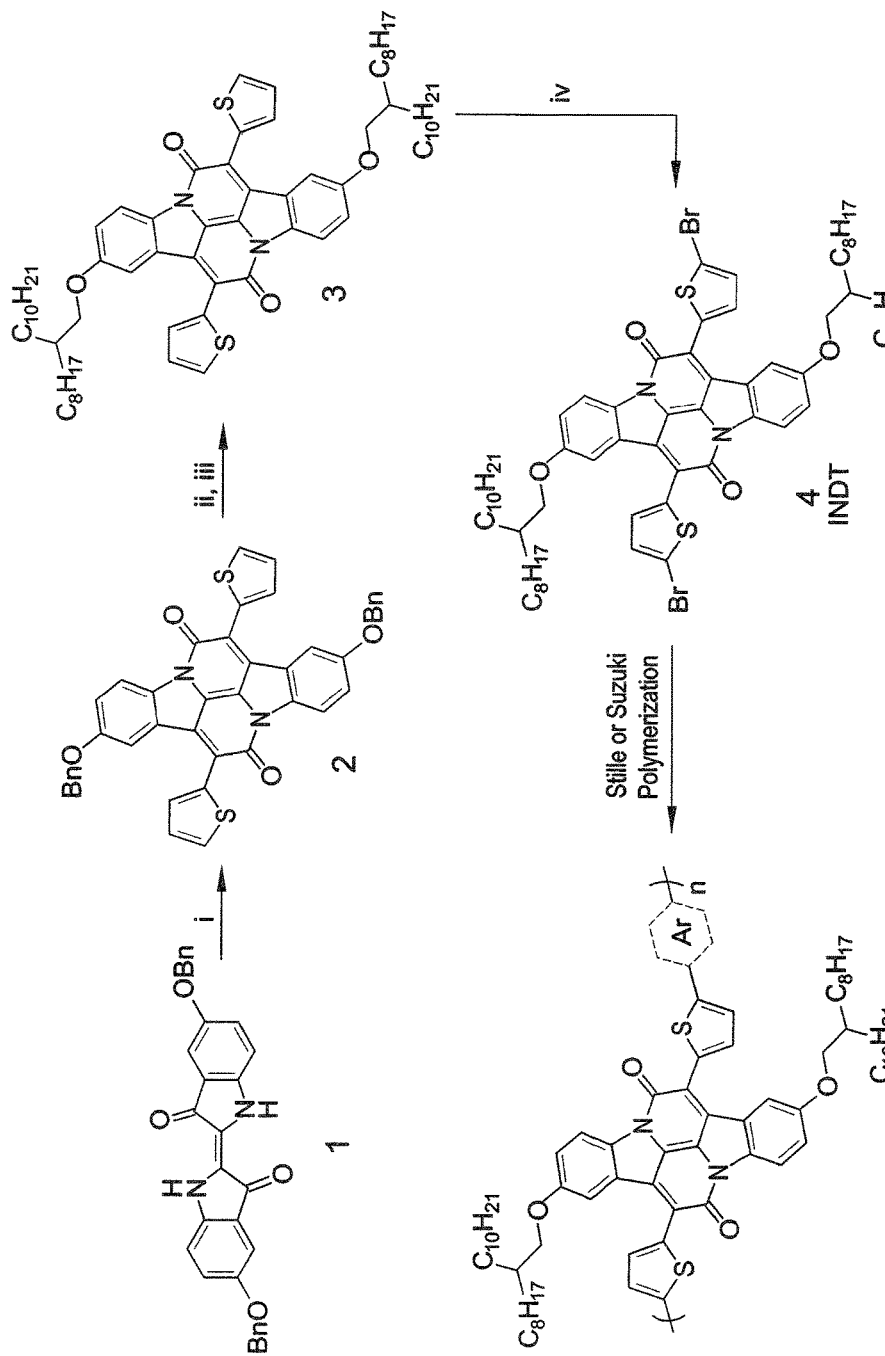
FIG. 1 is a reaction scheme for synthesizing the organic semiconductor polymers according to a first embodiment of the present invention.

The organic semiconductor polymers relate to polymers including an indolo-naphthyridine-6,13-dione thiophene (INDT) chromophore. The organic semiconductor polymers can be formed by polymerizing the INDT monomer with thiophene to obtain a conjugated polymer of the chromophore linked by thiophene monomers (INDT-T), with phenyl to obtain a conjugated polymer of the chromophore linked by phenyl monomers (INDT-P), with selenophene to obtain a conjugated polymer of the chromophore linked by selenophene monomers (INDT-S), or with benzothiadazole to obtain a conjugated polymer of the chromophore linked by benzothiadazole monomers (INDT-BT).

An exemplary semiconductor polymer includes a conjugated polymer having the following structural formula:

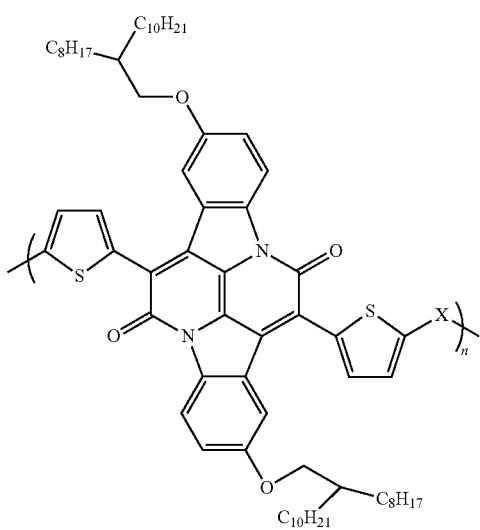

wherein X is thiophene, phenyl, selenophene, or benzothiadazole.

Also provided herein are chromophores having the following structural formula:

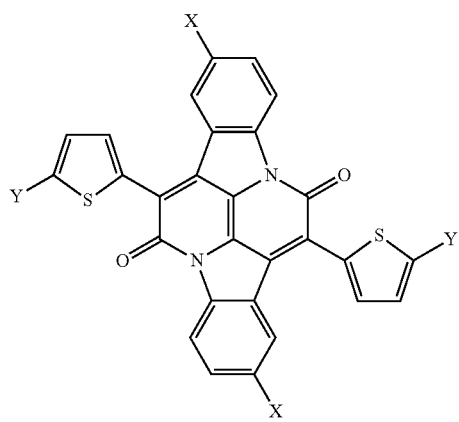

wherein X is hydroxyl or $OCH_2CH(C_8H_{17})C_{10}H_{21}$ and Y is hydrogen or a halogen.

The chromophore can be a component of the conjugated polymer of the organic semiconductor polymer. The organic semiconductor polymers have extremely narrow band-gap and high thin-film crystallinity resulting in ultra-high n-type charge transport in OFETs. Electron mobility over 3 cm2 Vs−1 was observed in benzothiadiazole copolymers arising from a highly ordered polymer backbone. The extent of backbone crystallinity varied significantly as determined by GIWAXS and could be correlated with the electron mobility of the conjugated polymer. OPV devices using the novel materials gave PCEs up to 4.1% in OPVs with demonstrable photocurrent generation occurring at wavelengths up to 1000 nm, whilst retaining good open circuit voltages. These results demonstrate the potential of this relatively unexplored chromophore in organic semiconductors as both an n-type transistor and a near-IR absorber in next generation organic electronic devices. Perhaps more importantly, these novel materials have allowed for a detailed understanding of the molecular origin of high n-type mobility in conjugated polymers.

The organic semiconductor polymers are ultra-narrow bandgap polymers with a novel core structure based on naturally occurring indigo. Despite the highly planar conformation of indigo, indigo has found little use in OPV devices due to fast deactivation through internal conversion following photoexcitation: The double-bond character of the central carbon-carbon bond is reduced and the molecule can rapidly lose energy through rotation to effect trans-cis isomerization, and by single or double proton transfer. These qualities can be overcome by performing annulation on both sides of the indigo molecule to create a new chromophore indolo-naphthyridine-6,13-dione thiophene, INDT, which retains the highly planar characteristics of indigo, however is rigid and cannot undergo rapid deactivation, thus enhancing suitability for organic electronic applications. Crucially, the implementation of materials using building blocks based on naturally occurring substances can begin to address the issues of sustainability associated with organic electronics The soluble monomer INDT can be used in conjugated polymers. Incorporation of this monomer unit in a conjugated polymer such as INDT-T results in an extremely narrow band gap material with high crystallinity. This polymer exhibits high ambipolar transport in OFET devices, with holes and electrons exhibiting mobilities of 0.23 and 0.48 cm2 V−1 s−1, respectively. Conventional and inverted OPV devices give efficiencies of up to 2.35% with photocurrent generated up to 950 nm, demonstrating the potential of this novel monomer unit for implementation in near-IR OPV devices. The structure/optoelectronic relationships described herein can contribute strongly to the bottom-up design of high mobility organic semiconductors.

Provided herein are two general methods for synthesizing INDT and the organic semiconductor polymers. According to a first synthesis method, depicted in FIG. 1, initial protection of 5-hydroxy-2-nitrobenzaldehyde with benzyl bromide proceeds in quantitative yield to give 5-(benzyloxy)-2-nitrobenzaldehyde. An aldol condensation with acetone gives (E)-5,5'-bis(benzyloxy)[2,2'-biindolinylidene]-3,3'-dione (1). This indigoid can then undergo condensation with 2-thiopheneacetyl chloride to give 2,9-bis(benzyloxy)-7,14-di(thiophen-2-yl)diindolo[3,2,1-de:3', 2',1'-ij][1,5]naphthyridine-6,13-dione (2). The benzyl groups of this IND core are stable to general hydrogenation deprotection conditions using Pd on activated charcoal. However near quantitative deprotection can be achieved using iodotrimethylsilane. Alkylation with 2-octyldodecanyl chains can then take place to improve solubility followed by bromination to provide monomer INDT (4) in excellent yield. Co-polymerization via Stille or Suzuki coupling of INDT with conventional comonomers, thiophene, phenyl, selenophene, or benzothiadazole, affords polymers INDT-T, INDT-S, INDT-BT, or INDT-P, respectively, which can be purified by Soxhlet extraction using acetone, then hexane, to remove low molecular weight oligomers, and finally chloroform. Interestingly, INDT-P exhibits poor solubility in chloroform and requires additional Soxhlet purification with chlorobenzene, which is somewhat surprising considering the larger twist the phenyl group usually induces in the polymer backbone, though not un-common and has been seen in other polymers.

Figure 2:
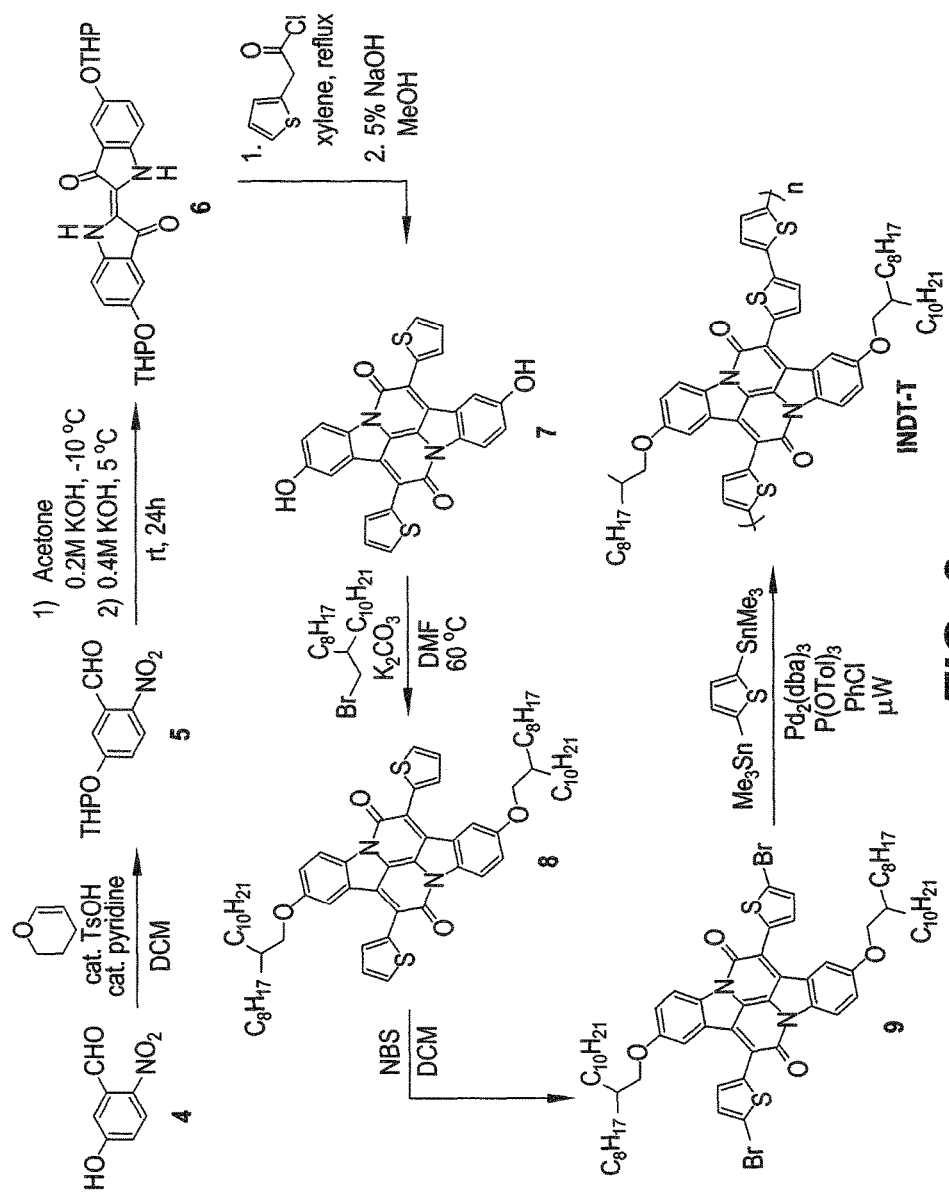
FIG. 2 is a reaction scheme for synthesizing the organic semiconductor polymers according to a second embodiment of the present invention.

According to a second synthesis method, depicted in FIG. 2, synthesis begins with protection of commercially available 5-hydroxy-2-nitrobenzaldehyde (4) with 3,4-dihydro-2H-pyran, followed by an aldol condensation to give (E)-5,5'-bis((tetrahydro-2H-pyran-2-yl)oxy)-[2,2'-biindolinylidene]-3,3'-dione. A subsequent condensation reaction and concurrent deprotection of the tetrahydropyranyl groups affords the 2,9-dihydroxy-7,14-di(thiophen-2-yl)-diindolo[3,2,1-de:3',2',1'-ij][1,5]naphthyridine-6,13-dione (INDT) compound 7. This compound can then be alkylated with 2-octyldodecyl chains to improve solubility and then subsequently brominated with N-bromosuccinimide to afford novel INDT monomer 9. Copolymerization via Stille coupling of monomer 9 with simple bis(trimethylstannyl)-thiophene affords polymer INDT-T, which can be purified by Soxhlet extraction using acetone, then hexane, to remove low molecular weight oligomers, and finally chloroform. The dark green polymeric product is soluble in common organic solvents such as chloroform and chlorobenzene.

Figure 3A:
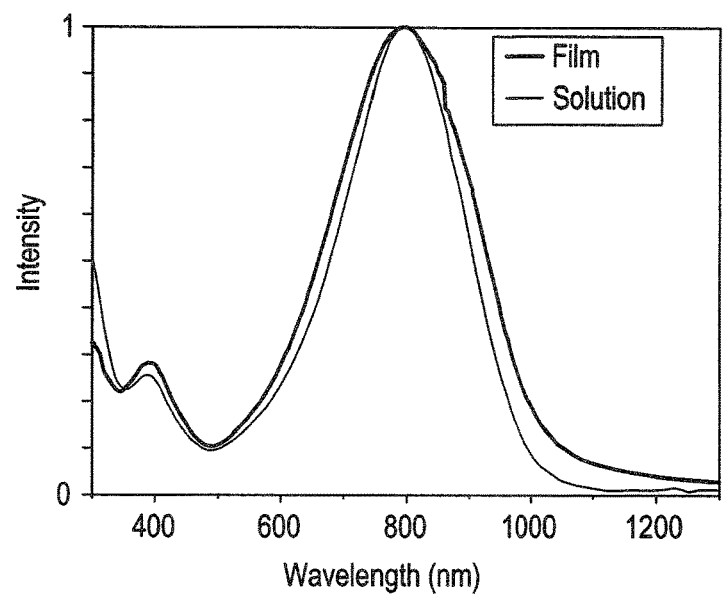
FIG. 3A is a graph illustrating the solution (chlorobenzene) and thin film (spincoated from a 5 mg/mL solution in chlorobenzene) UV-vis absorption spectra of INDT-T.

The molecular mass of INDT-T was determined by SEC (PS) to be Mn~15.7 kDa and Mw~49.4 kDa which, although is perhaps lower than optimal, is sufficient to evaluate the promise of this material in organic electronic devices. FIG. 3A shows the solution (chlorobenzene) and thin film (spin-coated from a 5 mg/mL solution in chlorobenzene) UV-vis absorption spectra of INDT-T. Both spectra show a broad featureless absorption in the near-IR with $\lambda$max ~790 nm. The spectrum becomes somewhat broadened on going from solution to thin films which is attributed to solid state packing effects, often observed in similar materials. The optical band gap in the film can be estimated to be ~1.22 eV, demonstrating the effectiveness of the IND core at creating near-IR-absorbing materials. The HOMO and LUMO energy levels were determined by XPS, and the optical energy gaps were found to be −4.24 and −3.02 eV, respectively. Both values are in a similar range to typical DPP and isoindigo polymers, thus showing that the IND containing polymers are an important addition to the bis-lactam containing conjugated polymer family. The physical and optical properties of INDT-T are provided in Table 1.

TABLE 1

| $M_n{}^a$ | $M_w{}^a$ | $PDI^a$ | $\lambda^{soln}_{max}$ (nm)$^b$ | $\lambda^{film}_{max}$ (nm)$^c$ | HOMO (eV)$^d$ | LUMO (Ev)$^e$ | Eg (eV)$^e$ | $E_g{}^{calc}$ (eV)$^f$ |
|---|---|---|---|---|---|---|---|---|
| 15700 | 49400 | 3.15 | 797 | 790 | −4.24 | −3.02 | 1.22 | 1.32 |

$^a$Determined by SEC(PS) using PhCl as eluent.
$^b$PhCl solution.
$^c$Spin-coated from PhCl 5 mg/mL.
$^d$Determined by XPS.
$^e$HOMO + optical energy gap.
$^f$Determined by TD-DFT using B3LYP/6-31g*.

Figure 3B:
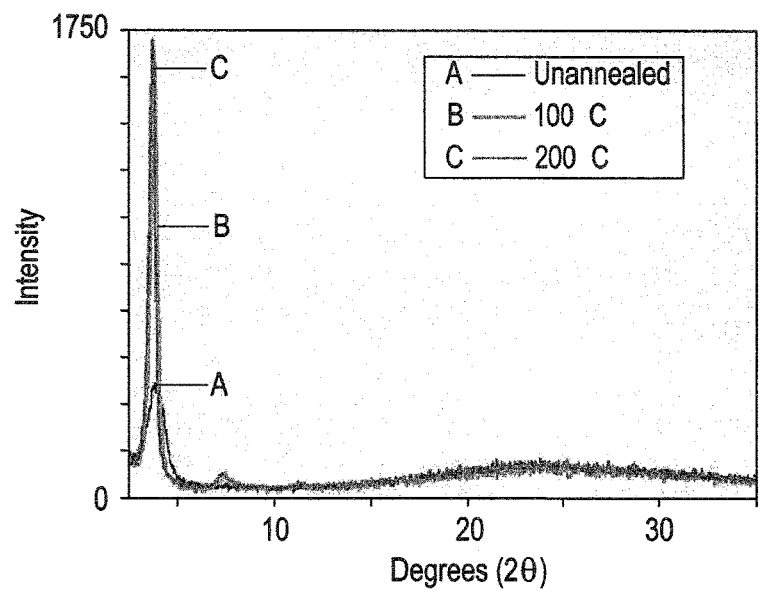
FIG. 3B is a graph depicting influence of annealing temperature on the molecular packing in INDT-T thin films was studied by X-ray diffraction according to the present invention.
Figure 4B:
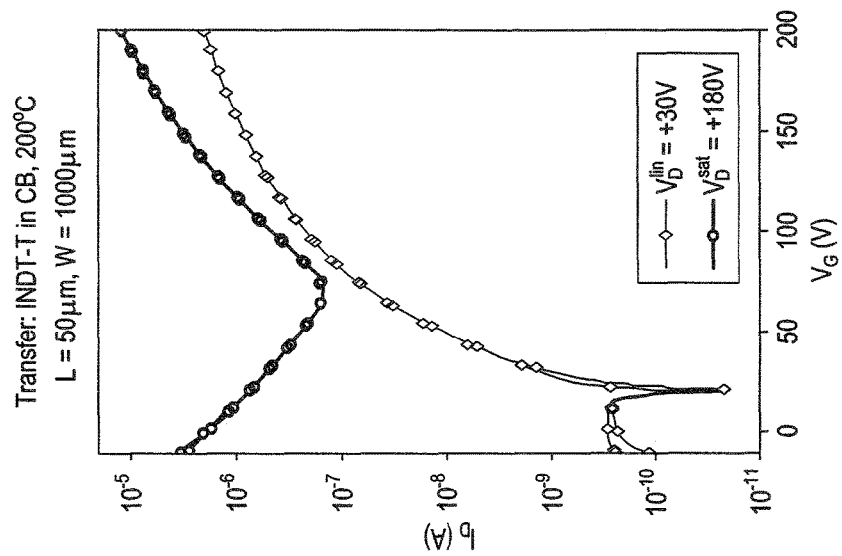
FIGS. 4A, 4B, 4C, and 4D are graphs showing transfer and output characteristics of OFET devices of INDT-T annealed at 200° C. according to the present invention.
Figure 4A:
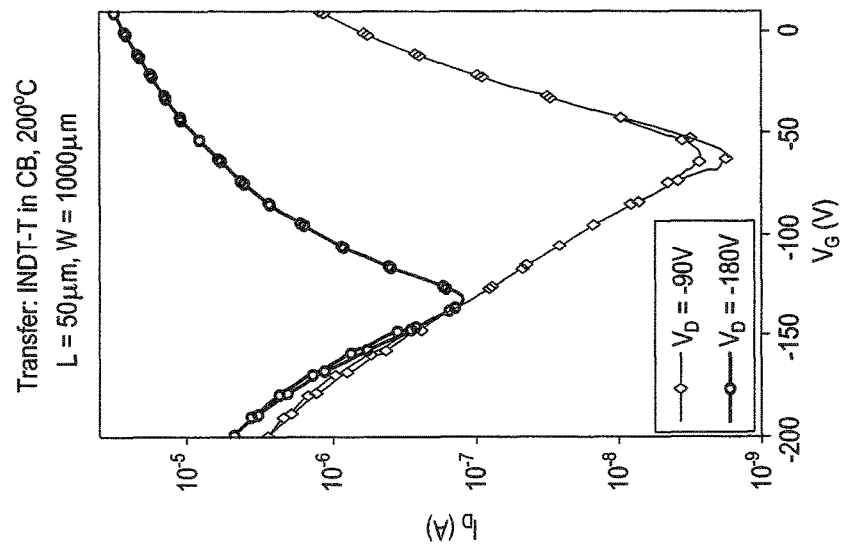
Figure 4D:
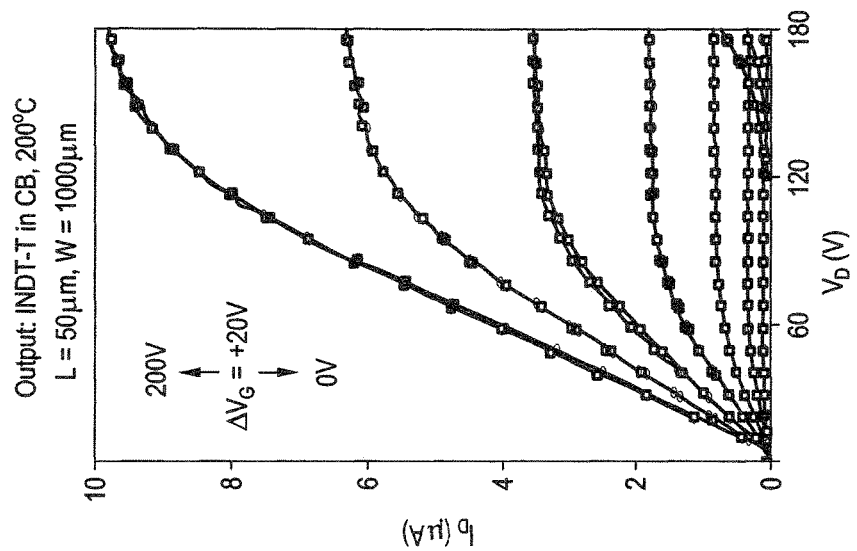
Figure 4C:
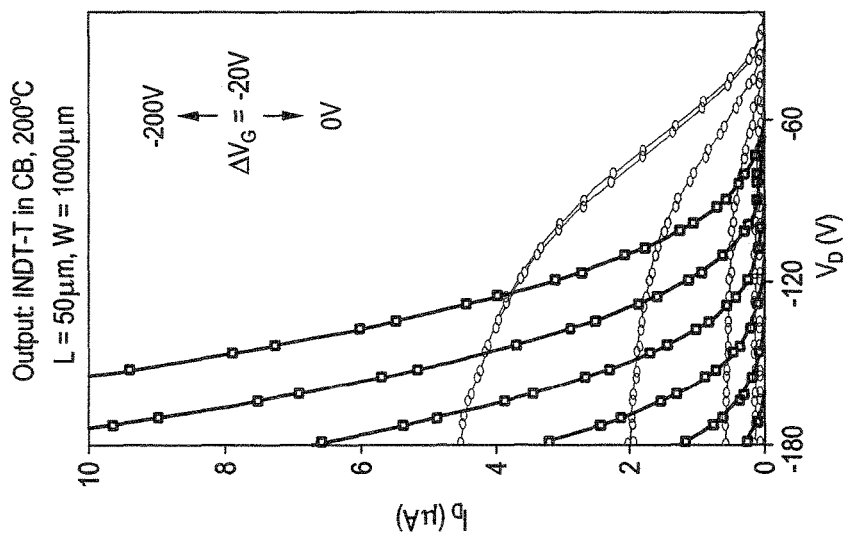

The influence of annealing temperature on the molecular packing in INDT-T thin films was studied by X-ray diffraction (FIG. 3B). Drop-cast polymer thin films (5 mg/mL solution in chlorobenzene) show a Bragg reflection at 2θ=3.8°, corresponding to the (100) reflection and indicative of a typical lamellar packing distance of 2.3 nm. Annealing at 100° C. for 10 min leads to a substantial increase in thin film crystallinity as observed by the increased intensity of the (100) peak, though this improvement may not necessarily arise from increased ordering of the π-π stacking in the thin film. The appearance of the corresponding (200) reflection also indicates increased long-range order. No noticeable changes in the film crystallinity are observed after annealing at higher temperatures.

To investigate the electronic structure of the new polymer, DFT calculations were carried out on model trimers with methoxy substituents. The calculated energy gap is found to be 1.32 eV, in good agreement with experiment. According to HOMO and LUMO distributions of the geometry optimized structure of INDT-T using Gaussian 09 (DFT, B3LYP/6-31G*), the backbone displays a high degree of coplanarity indicating that charge transport in this material should be efficient (see, FIG. 3 of Appendix 1, the entire contents of which are incorporated herein by reference). Both the HOMO and LUMO are delocalized well over both the thiophenes and the central bislactam core. However, while there is little contribution to the HOMO from the peripheral phenyl groups, there is substantial delocalization of the LUMO onto these sites. This indicates that further substitutions at these positions will enable independent manipulation of the LUMO level without disruption of the HOMO.

OFETs with top gate-bottom contact architecture were fabricated using the novel polymer on glass substrates with CYTOP dielectric. Al+Au bilayer (20 nm+20 nm) electrodes for ambipolar charge transport were used. The organic semiconductor layer was spin-coated on top of the substrates from a chlorobenzene solution (10 mg/mL). Finally, CYTOP dielectric was spin-coated on top followed by a thermally evaporated Al gate electrode. Representative transfer and output characteristics are shown in FIGS. 4A-4D, and data are compiled in Tables 2 and 3.

TABLE 2

OFET Characteristics of INDT-T

| Annealing temp (° C.) | Channel length (μm) | $\mu_{hole}{}^{a,b}$ (peak value) ($cm^2\,V^{-1}\,s^{-1}$) | $V^{th}$, hole$^c$ (V) | Ion/Ioff for holes$^c$ | $\mu_{electron}{}^{a,b}$ (peak value) ($cm^2\,V^{-1}\,s^{-1}$) | $V^{th}$, electron$^c$ (V) | Ion/Ioff for electrons$^c$ |
|---|---|---|---|---|---|---|---|
| 100 | 40 | 0.04 ± 0.003 (0.046 ± 0.002) | −120 ± 8 | $10^4$ | 0.075 ± 0.001 (0.11 ± 0.03) | 43 ± 5 | $10^5$ |
|  | 50 | 0.076 (0.09) | −23 | $10^5$ | 0.075 (0.094) | 22 | $10^6$ |
|  | 100 | 0.048 (0.069) | −90 | $10^5$ | 0.079 (0.13) | 29 | $10^6$ |
| 200 | 50 | 0.23 ± 0.01e (0.52 ± 0.08) | −131 ± 2 | $10^3$ | 0.48 ± 0 (1.2 ± 0.05) | 52 ± 3 | $10^6$ |

$^a$Determmed by SEC(PS) using PhCl as eluent.
$^b$PhCl solution.
$^c$Spin-coated from PhCl 5 mg/mL.
dDetermined by XPS.
eHOMO + optical energygap.
fDetermined by TD-DFT using B3LYP/6-31g*.

The 100° C. annealed film maximum hole and electron mobilities extracted from the saturation regime of the transfer curves are both approximately 0.08 $cm^2\,V^{-1}\,s^{-1}$, demonstrating good balanced ambipolar behavior and negligible hysteresis. Annealing the devices at 200° C. leads to significant improvement in both the hole and electron mobility. A high hole mobility of 0.23 cm2 V−1 s−1 is determined from the best fit of the second derivative of transfer curve saturation regime with the peak value measured being 0.52 cm2 V−1 s−1. The best-fit value for the electron mobility is 0.48 cm2 V−1 s−1 with a remarkable peak mobility of 1.2 cm2 V−1 s−1. However it is noted that there was a significant amount of noise present in the second-derivative mobility extraction plot. As was shown in XRD experiments, the improved OFET characteristics are due to the increased ordering of the INDT-T polymer with annealing. The threshold voltage for electrons is in the range of ~20-50 V which is comparable to values measured in DPP and isoindigo-based OFETs. However, the large threshold voltages for holes indicate an injection barrier. This can be attributed to nonoptimized matching of the electrodes and the polymer HOMO. To overcome this, OFETs with UV-O3-treated Au electrodes with an Al adhesion layer (40+5 nm) for optimized hole injection due to a deeper work function were fabricated. The results are shown in Table 3.

TABLE 3

Hole Optimized Ofet Characteristics of INDT-T

| Annealing temp (° C.) | Channel length(μm) | μ hole$^{a,b}$ (peak value) ($cm^2\,V^{-1}\,s^{-1}$) | Vth, hole$^c$ (V) | Ion/Ioff for holes$^c$ |
|---|---|---|---|---|
| 100 | 30 | 0.1 ± 0.01d (0.13 ± 0.015) | −14 ± 0.5 | $10^4$ |

$^a\mu_{hole}$ refers to the highest effective mobilities measured in the saturation regime for a gate-voltage range of 20 V.
$^b$Peak values for saturation regime mobility are given in parentheses next to the best-fit values because the second-derivative plots are noisier.
$^c$The threshold voltages ($V_{th}$) and the on-to-off ratios ($I_{on}/I_{off}$) were extracted from the linear regime ($V_d = -30$ V) for holes.
dAverage of two devices.

Only p-type transport is observed for these devices; however, it is clear that both the measured hole mobility and threshold voltage are significantly improved relative to the equivalent devices presented in Table 2. This indicates that the larger threshold voltages observed in the initial device data are likely due to improper work function matching or suboptimal metal-polymer contact. Bottom gate-bottom contact OFET devices were also fabricated, but these suffered from significant hysteresis and lower mobilities. Conventional and inverted bulk-heterojunction OPV devices were fabricated using a 1:2 blend of INDT-T:PC71BM as the active layer spin-coated from a 4:1 CHCl3:ODCB solution (10 mg/mL). The data are presented in Table 4. (The J-V curves and EQE are shown in attached FIG. 1 of Appendix 1, the entire contents of which are incorporated herein by reference).

TABLE 4

OPV Device Characteristics of INDT-T Based Solar Cells

| Architecture | Jsc (mA cm$^{-2}$) | Voc (V) | FF | PCE (%) |
|---|---|---|---|---|
| Conventional | 6.27 | 0.62 | 0.58 | 2.25 |
| Inverted | 6.88 | 0.59 | 0.58 | 2.35 |

The conventional OPV device provides a PCE of 2.25%, with a short circuit current (Jsc) of 6.27 mA cm-2, an open circuit voltage (Voc) of 0.62 V, and a fill factor (FF) of 0.58. The relatively high open circuit voltage is impressive considering the extremely narrow band gap of INDT-T, and the devices all have relatively good fill factors, indicating good charge extraction at low fields. The inverted devices show similar overall efficiencies of 2.35% but have slightly increased short circuit currents (Jsc=6.88 mA cm-2) and lower open circuit voltages (Voc=0.59 V). Similar variations between conventional and inverted OPV devices have been shown before in DPP-based conjugated polymers.

The EQE shows that the majority of the photocurrent originates from the fullerene absorption, but there remains an appreciable contribution from the extremely near-IR absorbing INDT-T polymer up to 950 nm. Despite the modest overall efficiencies, these devices represent some of the highest efficiencies from such ultra-narrow band gap materials. The lower contribution to the photocurrent can be predominantly due to insufficient energetic offset of the polymer with respect to the fullerene.

All of the present polymers display good and comparable molecular weights with slightly high polydispersities as determined by GPC using PS standards and chlorobenzene as eluent. The polydispersities, although slightly high were fairly symmetrical in distribution. Table 5 provides the physical and optical properties of the INDT polymers.

TABLE 5

Physical and Optical Properties of INDT Polymers

| Polymer | $M_n{}^a$ | $M_w{}^a$ | $PDI^a$ | $\lambda_{max}^{soln}$ (nm)$^b$ | $\lambda_{max}^{film}$ (nm)$^c$ | HOMO (eV)$^d$ | LUMO (eV)$^e$ | $E_g$ (eV)$^b$ | $E_g{}^{calc}$ (eV)$^f$ |
|---|---|---|---|---|---|---|---|---|---|
| INDT-T | 20 | 80 | 4.00 | 802 | 805 | −5.02 | −3.76 | 1.26 | 1.32 |
| INDT-S | 25 | 83 | 3.32 | 844 | 849 | −4.99 | −3.77 | 1.22 | 1.36 |
| INDT-BT | 40 | 119 | 2.98 | 826 | 820 | −4.97 | −3.74 | 1.23 | 1.31 |
| INDT-P | 29 | 103 | 3.55 | 717 | 736 | −5.14 | −3.74 | 1.40 | 1.60 |

Figure 5A:
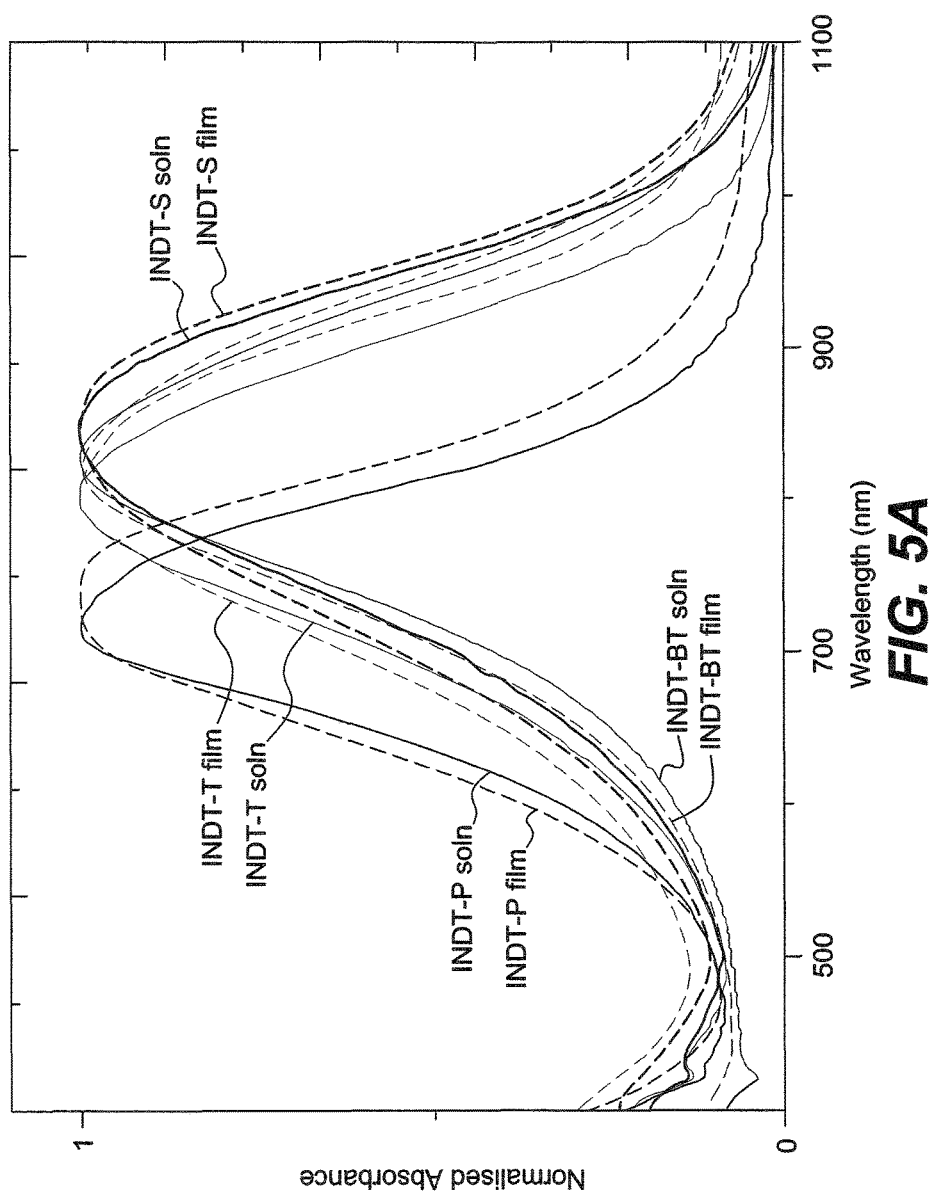
FIG. 5A is a graph showing normalized UV-Vis absorption spectra of the INDT polymers according to the present invention.

FIG. 5A shows the solution (chlorobenzene) and thin film (spin-coated from a 5 mg/mL solution in chlorobenzene) UV/Vis absorption spectra of the four polymers. The spectra of INDT-T, INDT-S and INDT-BT show broad featureless absorption in the near-IR region whereas the spectrum of INDT-P is considerably blue-shifted, arising from a widening of the band gap caused by reduction of the molecular orbital overlap introduced by twisting of the polymer backbone. All spectra become somewhat broadened on going from solution to thin films which is attributed to solid state packing effects, often observed in similar materials.

Figure 5B:
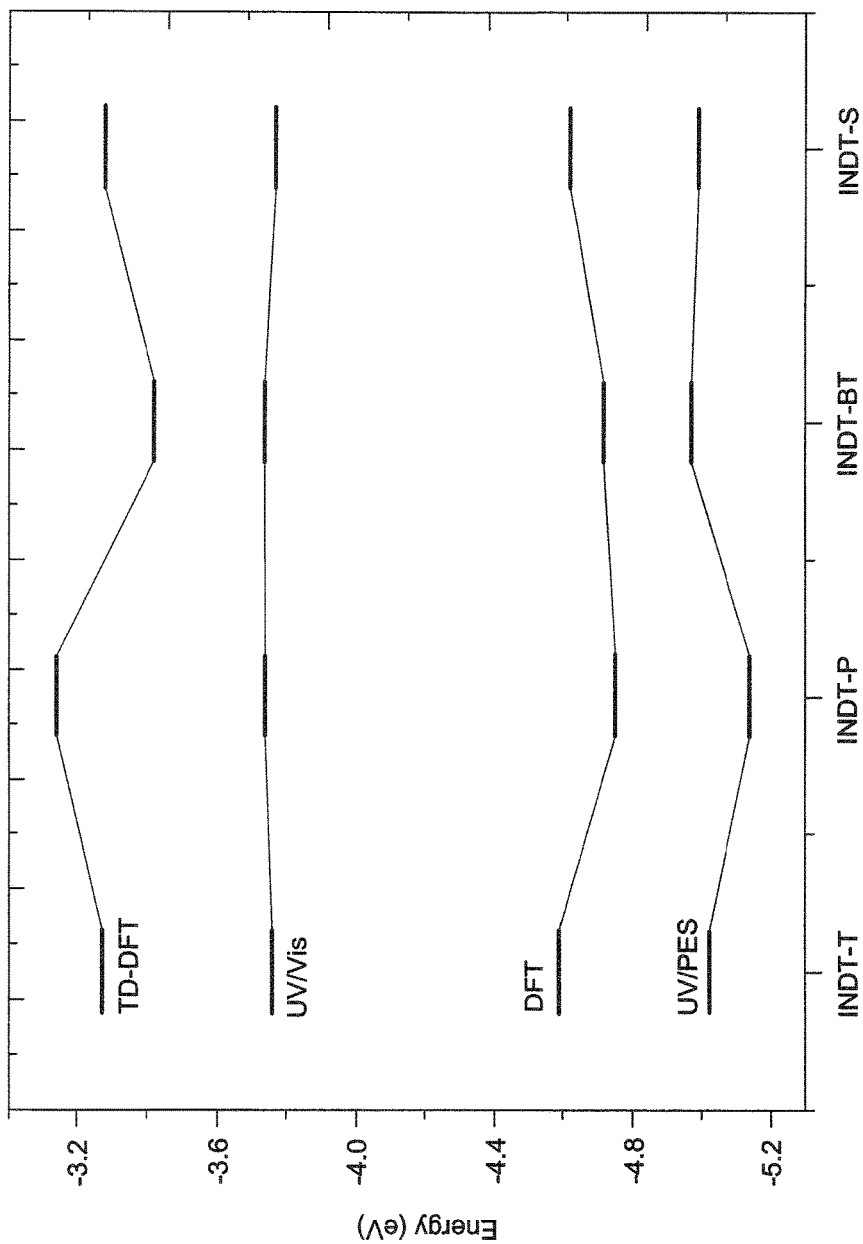
FIG. 5B is a graph showing visualization of band gaps from computational (black) and spectroscopic (blue) experiments.

To investigate the electronic structure of the INDT polymers, density functional theory (DFT) calculations were carried out on model trimers with methoxy substituents. Experimentally, the HOMO energy levels were determined using UV-PES (see S3) and the energies of the LUMOs were resolved by the addition of the corresponding optical band gap. The energy levels and band gaps of the four polymers are displayed in FIG. 5B. The trend in experimental and theoretical data for the HOMO energies are generally in good agreement, with the exception of INDT-BT which has a more negative value than would be expected. The comparison of the two sets of data for the LUMO energy levels shows poor alignment between theory and experiment and remarkably, the experimental LUMO energy levels for all four INDT polymers are either 3.7 or 3.8 eV, almost identical within experimental error. The molecular orbital distributions of the geometry-optimized structure of each polymer using Gaussian 09 (DFT, B3LYP/6-31G*) are shown in the supporting information (S4). All four polymers have delocalized HOMOs and LUMOs along their backbones, which display high degrees of co-planarity suggesting that charge transport in these materials should be efficient.

Figure 6:
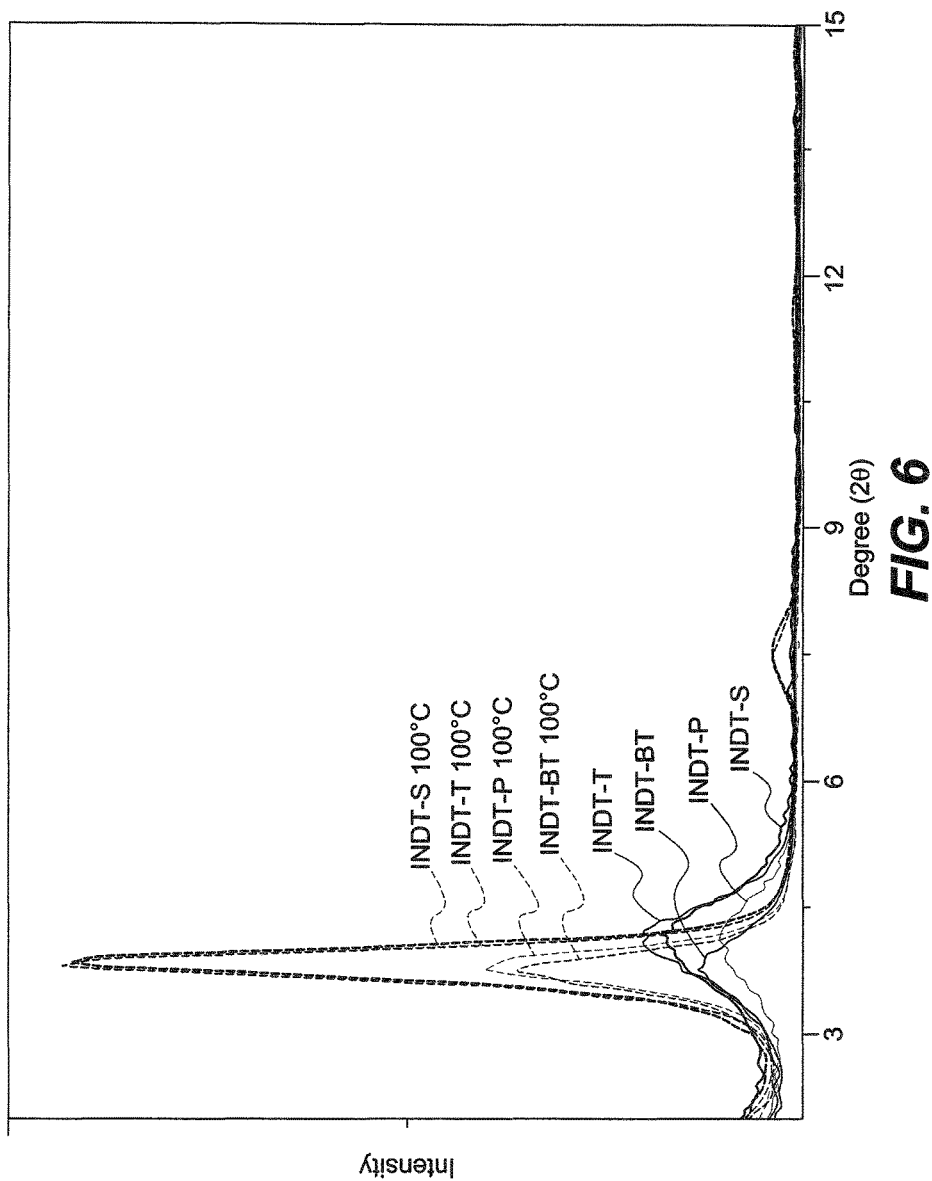
FIG. 6 shows X-ray diffraction of drop-cast INDT polymer films from 5 mg/mL solutions in chlorobenzene according to the present invention.

The influence of annealing temperature on the molecular packing in the polymer thin films was studied by X-ray diffraction (FIG. 6). Drop-cast polymer thin films show a Bragg reflection at 2θ=3.8°, corresponding to the (100) reflection and indicative of a typical lamellar packing distance of 2.3 nm.

Annealing at 100° C. for 10 min leads to a substantial increase in thin film crystallinity as observed by the increased intensity of the (100) peak. The appearance of the corresponding (200) reflections for INDT-T and INDT-S indicates increased long-range order in these two polymer films. No noticeable changes in film crystallinity are observed after annealing at higher temperatures.

Staggered top-gate, bottom-contact (TG-BC) OFETs on glass substrates exhibited superior device performance and lower hysteresis relative to coplanar bottom-gate, bottom-contact (BG-BC) structures on HMDS-treated silicon wafer substrates. This is attributed to charge trapping at the interface of the semiconductor and the HMDS-treated silicon dioxide dielectric, combined with the higher parasitic contact resistance (RC) in the coplanar geometry.

TG-BC OFET devices were fabricated on solvent-cleaned glass substrates with thermally evaporated source and drain (SD) electrodes. The organic semiconductor layers were spin-cast from chlorobenzene solution (10 mg/mL) and CYTOP dielectric spin-cast directly onto the polymer thin-films, followed by a thermally evaporated aluminum gate electrode. All devices had channel dimensions of length (L)=40 μm and width (W)=1000 μm.

Three types of SD contacts were employed: 1) as-deposited Au on Al bilayers for ambipolar charge injection, 2) surface-treated Au for p-type enhancement, and 3) surface-treated Al for n-type enhancement. The work function of air-exposed Au is significantly deepened upon treatment with UV/ozone facilitating superior hole injection both by removing organic contaminants from the metal surface and forming a native oxide layer. The modified work function is a better match to the HOMO energies of the polymer series, lowering the hole injection barrier and reducing RC. N-type performance can be enhanced by treating Al with ethoxylated polyethylenimine (PEIE) to reduce the work function to better match the LUMO energies of the polymers, improving electron injection.

Figure 7A:
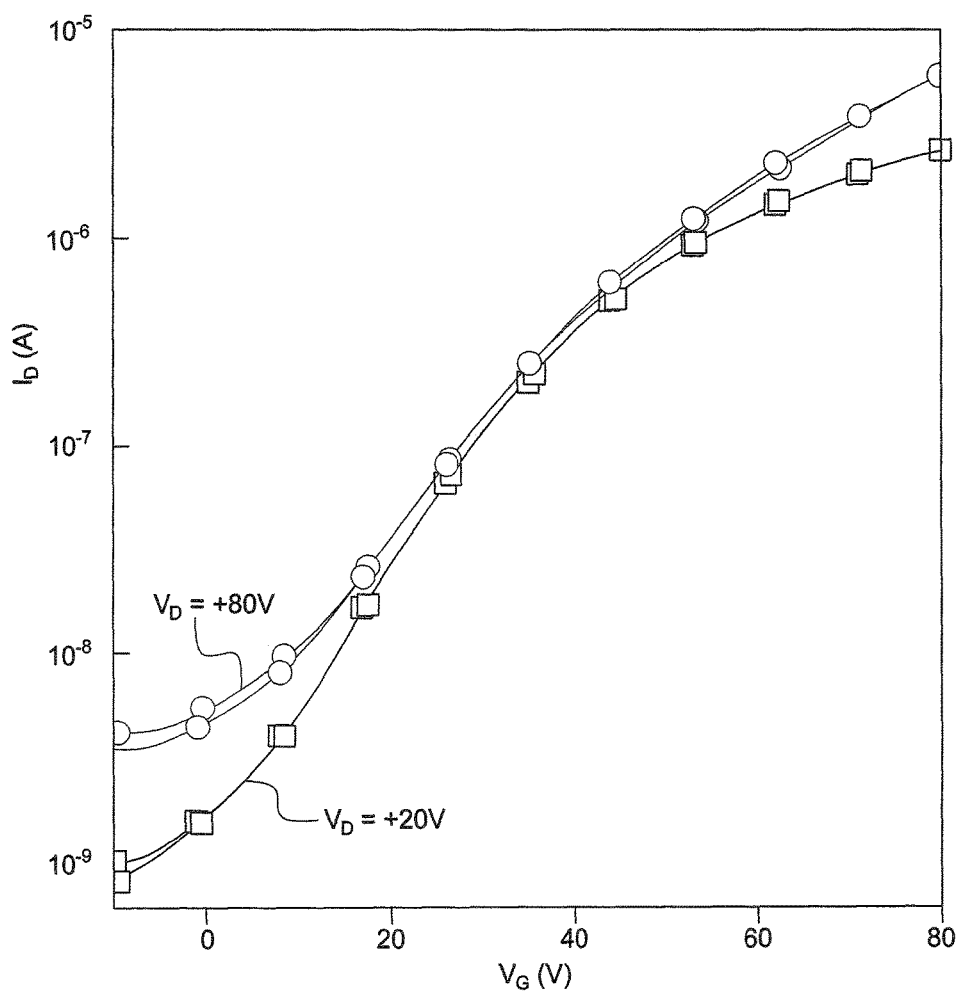
FIG. 7A shows transfer characteristics of an n type enhanced INDT-BT OFET annealed at 190° C. having channel dimensions of length (L)=40 $\mu$m and width (W)=1000 $\mu$m.
Figure 7B:
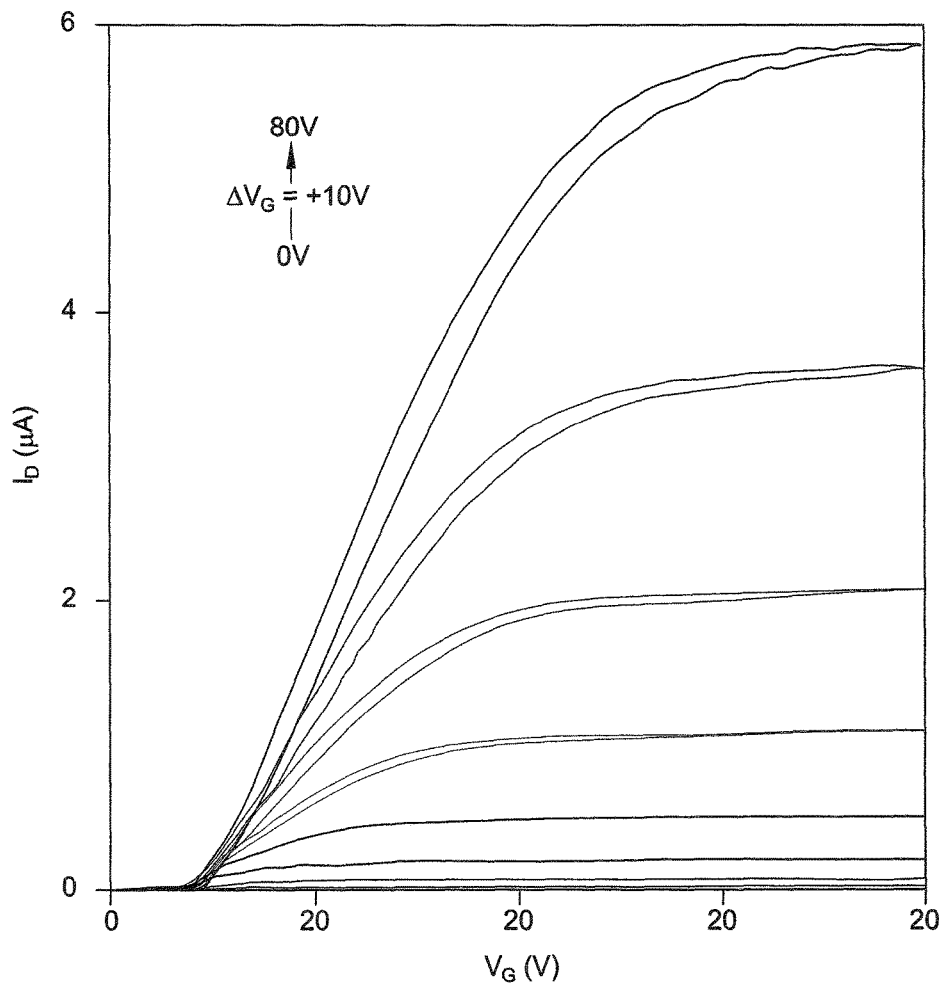
FIG. 7B shows output characteristics of an n type enhanced INDT-BT OFET annealed at 190° C. having channel dimensions of length (L)=40 μm and width (W)=1000 μm.

FIGS. 7A-7B show transfer and output characteristics, respectively, of an n type enhanced INDT-BT OFET annealed at 190° C. having channel dimensions of length (L)=40 μm and width (W)=1000 μm. Table 6 shows OFET characteristics of the four INDT-based polymers annealed at 190° C.

TABLE 6

OFET characteristics of the four INDT-based polymers annealed at 190° C.$^a$

| Polymer | Type$^b$ | $I_{D(lin)}^{on\text{-}off}$ | $I_{D(sat)}^{on\text{-}off}$ | $V_{On(lin)}$ [V] | $V_{Th(sat)}$ [V] | $\mu_{sat}{}^c$ [cm$^2$ Vs$^{-1}$] |
|---|---|---|---|---|---|---|
| INDT-P | p | $10^2$ | $10^2$ | −104 | −155 | 0.002 |
|  | n | $10^3$-$10^4$ | $10^3$ | +10 | +89 | 0.028 |
| INDT-T | p | $10^4$ | $10^1$-$10^2$ | −25 | −92 | 0.29 |
|  | n | $10^4$-$10^5$ | $10^3$-$10^4$ | −10 | +37 | 0.31 |

TABLE 6-continued

OFET characteristics of the four INDT-based polymers annealed at 190° C.[a]

| Polymer | Type[b] | $I_{D(lin)}^{on\text{-}off}$ | $I_{D(sat)}^{on\text{-}off}$ | $V_{On(lin)}$ [V] | $V_{Th(sat)}$ [V] | $\mu_{sat}^{c}$ [cm$^2$ Vs$^{-1}$] |
|---|---|---|---|---|---|---|
| INDT-S | p | $10^3$ | $10^1$-$10^2$ | −40 | −101 | 0.20 |
|  | n | $10^4$-$10^5$ | $10^3$ | −10 | +74 | 0.99 |
| INDT-BT | p | $10^4$ | $10^1$ | −36 | −121 | 0.52 |
|  | n | $10^5$ | $10^4$ | −10 | +74 | 3.11 |

Transistors were evaluated after annealing at 100° C. and 190° C., the latter representing the upper limit of the temperature range for which PEIE treatment is most effective. OFET parameters were extracted from transfer characteristic data, which demonstrates the gate voltage (VG) dependence of the source-drain current (ID), using the standard gradual channel approximation for field-effect transistors. Linear regime mobility (μlin) was calculated using the first derivative of the linear regime transfer curve. Threshold voltage (VTh) was extracted by applying a linear fit to the square-root of the saturation regime transfer curve. FIGS. 7A-7B show the transfer and output characteristics of an n-type enhanced OFET with INDT-BT annealed at 190° C. Despite the outlined efforts to reduce charge injection barriers, the s-shaped non-linear output observed at low source-drain voltage (VD) and the lower VTh observed at longer channel lengths indicate a large RC and contact limited device performance. The standard linear regime operation model does not adequately describe the device physics of this non-ideal OFET and thus the extracted μlin is not representative of the bulk property.

Furthermore, the standard VTh extraction procedure typically yields an overestimate in contact-limited devices, and the square-root method of extracting the saturation regime mobility (μsat) can be unreliable.42, 43 Values that better represent the bulk properties of the semiconductor were extracted by applying very large voltages to compensate for the large RC and using the second derivative of the saturation regime transfer curve for the μsat calculation. Mobilities were extracted from the appropriate voltage region of the forward voltage sweep. Saturation regime mobility data were smoothed prior to extracting μsat in order to exclude extreme values and yield a conservative estimate.

Complete OFET electrical characterization data for devices of each polymer are available in the SI (S5), and Table 6 shows the best device results for all four polymers. INDT T shows balanced ambipolar transport, and both INDT-S and INDT-BT show excellent n-type charge transport characteristics and good p-type device performance in single charge polarity enhanced devices. INDT P devices have relatively smaller maximum ID and yield significantly lower mobilities due to non-uniformities in the polymer film arising from the lower solubility of INDT-P in chlorobenzene. The poor p-type performance of INDT-P devices can also be attributed to a larger hole injection barrier resulting from the higher HOMO, as evident from the greater magnitude of the VTh and the highly non-linear output characteristics at low VD.

Remarkably, the saturation regime electron mobility of INDT-BT approaches, and in a champion device exceeds, 3 cm2 Vs−1 (see FIG. 5 of Appendix 2, the entire contents of which are hereby incorporated by reference, where transfer and output characteristics of n-type enhanced and p-type enhanced OFET devices with INDT-BT annealed at 190° C. with channel dimensions of length (L)=40 μm and width (W)=1000 μm are discussed). Table 7 shows a greater part of the data collected on INDT-BT devices. N type enhanced devices exhibit a mean μsat of 2.8±0.3 cm2 Vs−1, and the champion device yields an impressive μsat of 3.1 cm2 Vs−1. These results indicate that INDT-BT is one of the highest mobility n-type organic semiconductors reported to date in the peer-reviewed literature. Pleasingly, the performance of INDT-BT OFETs is highly reproducible and values reported herein represent 23 individual devices fabricated identically over an extended period of time. The output characteristics of INDT BT indicate that the device is strongly contact-limited, and thus it is likely that the mobility reported here is an underestimate of the bulk property.

TABLE 7

OFET characteristics of INDT-BT OFET devices

| T[a] [° C.] | Type | $I_{D(lin)}^{on\text{-}off}$ | $I_{D(sat)}^{on\text{-}off}$ | $V_{On(lin)}$ [V] | $V_{Th(sat)}$ [V] | $\mu_{sat}$ [cm$^2$ Vs$^{-1}$] |
|---|---|---|---|---|---|---|
| 100 | p[b] | $10^2$-$10^3$ | $10^1$ | −80 | −150 | 0.18 |
|  | n[b] | $10^5$-$10^6$ | $10^3$ | +9 | +83 | 1.05 |
|  | p[b] | $10^3$-$10^4$ | $10^1$ | −44 | −133 | 0.20 |
| 190 | p[c] | $10^4$ | $10^1$ | −36 | −121 | 0.52 |
|  | n[b] | $10^5$ | $10^2$-$10^3$ | +18 ± 2 | +115 ± 4 | 1.8 ± 0.3[d] (2.3) |
|  | n[c] | $10^4$-$10^5$ | $10^4$ | −9 ± 1 | +77 ± 3 | 2.8 ± 0.3[e] (3.1) |

Extracted μlin values (supporting information S5) are far smaller than the corresponding μsat values for each device type, and VTh values from devices with untreated SD contacts are very large, both providing further evidence of contact-limited performance.41 The non-linearities in the low voltage output data indicate that the μlin values are a significant underestimate of the bulk property Enhancing both p- and n-type OFETs with surface treated SD electrodes both greatly increases the extracted μsat and decreases the magnitude of the extracted VTh demonstrating effective lowering of the respective charge injection barriers. In comparison to the ambipolar OFET devices with bilayer SD electrodes, devices with PEIE-treated Al SD showed far superior n-type performance relative to devices with untreated Al SD. Hence, the dramatically improved n-type performance of the enhanced devices can be attributed primarily to the presence of the PEIE electron injection layer and not the use of low work function SD electrodes.

The almost complete similarity in LUMO energies of these four polymers provides a unique chance to examine structure/optoelectronic relationships of these polymers irrespective of LUMO energy. We were keen to investigate whether the superior electron transport properties exhibited by INDT BT arises from morphological features. Atomic force microscopy (AFM) images were taken of 5 μm² samples of INDT polymer thin-films on glass substrates prepared identically to the semiconducting layer in the above OFETs (see FIG. 6 of Appendix 2, the entire contents of which are hereby incorporated by reference). (Phase information, surface roughness histograms and higher resolution 1 μm2 scans are provided in the supporting information, S6).

When viewed with AFM, the morphology of the INDT BT films differ significantly from the other polymers: INDT-T, INDT-S and INDT-P films all exhibit a relatively flat polycrystalline structure, while INDT-BT forms thin-films with high surface roughness that contain a network of smooth ribbon-like features. The ultra-high electron transport of INDT-BT suggests that its thin-films are not amorphous, and are instead self-aligned and highly ordered crystalline systems. Grazing incidence wide-angle x-ray scattering (GIWAXS) was performed to examine the differing intermolecular interactions in the thin-film of INDT-T, INDT-S and INDT-BT. The 2D images are presented in the SI (S7) and the out-of-plane ($q_z$) and in-plane ($q_{xy}$) line cuts are presented in FIG. 7 of Appendix 2, the entire contents of which are hereby incorporated by reference. Crystalline correlation lengths (CCL) and d-spacings of the three polymers calculated from the GIWAXS data are presented in Table 8 and CCLs were calculated using a Scherrer analysis modified for a 2D detector.44 In general, the three polymers have similar crystallinities and orientations; however there are a few key differences that help explain their performance variations.

TABLE 8

GIWAXS correlation lengths and d-spacings of diffraction planes of INDT polymer thin-films

| Polymer | Edge-on[a]/ Face-on[b] | d-spacing (Å) | | | Correlation length (nm) | | |
|---|---|---|---|---|---|---|---|
| | | (100) | (010) | (001)[c] | (100) | (010) | (001)[c] |
| INDT-BT | Edge-on | 23.3 | 3.66 | 17.8 | 13 | 2.7 | 23 |
| | Face-on | 26.5 | 3.5 | — | 9.9 | 3.3 | — |
| INDT-S | Edge-on | 22.8 | 3.62 | 17.3 | 13 | 2.7 | 9.6 |
| | Face-on | 27.2 | — | — | 4.9 | — | — |
| INDT-T | Edge-on | 22.4 | 3.66 | 17.5 | 15 | 2.5 | 11.8 |
| | Face-on | 22.4 | — | — | 2.1 | — | — |

Figure 8:
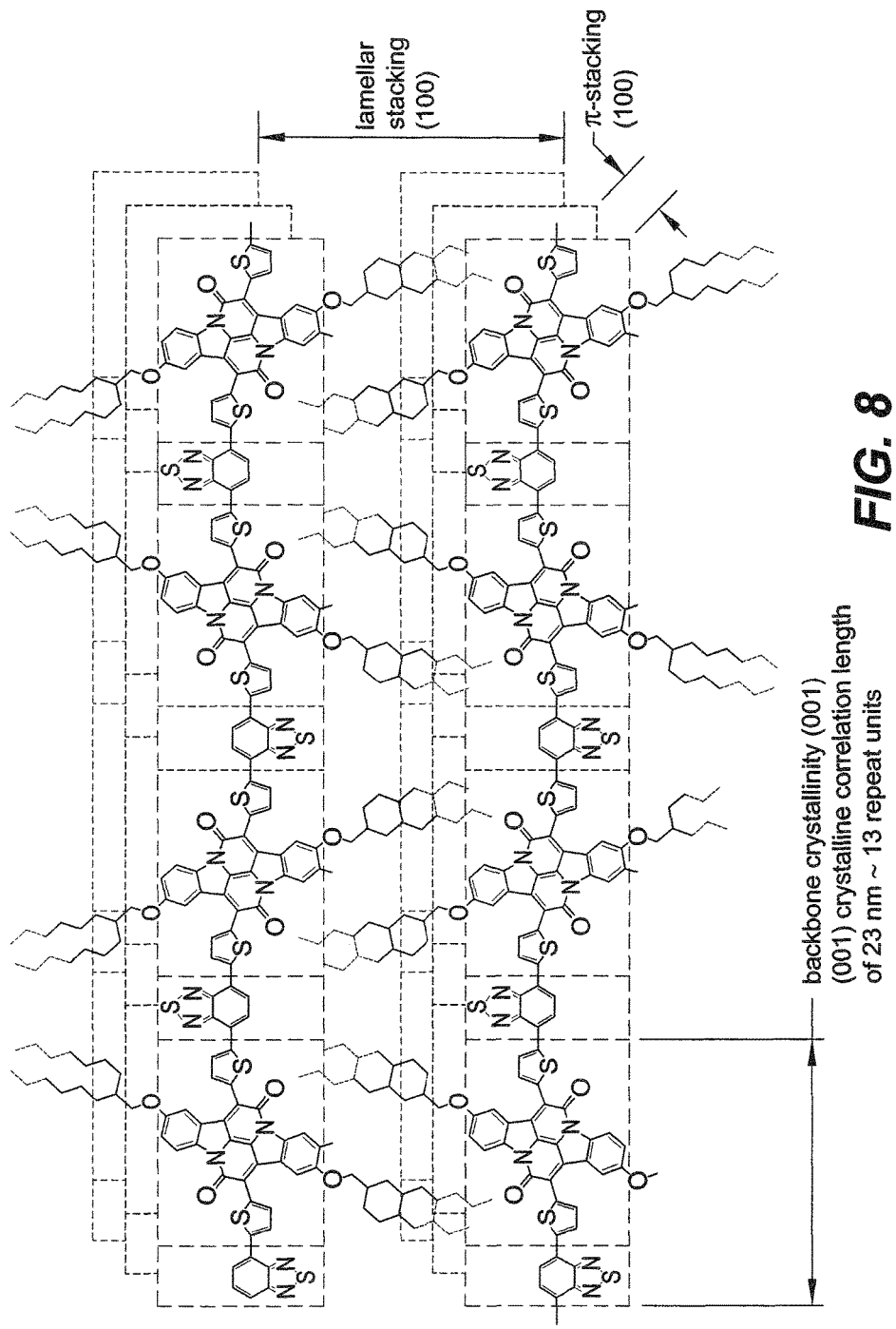
FIG. 8 is a diagram showing visualization of the GIWAXS results of the thin-film crystallinity of INDT-BT according to the present invention.

[a]Edge-on domains include out-of-plane ($q_z$) (100) peaks and in-plane ($q_{xy}$) (010) peaks
[b]Face-on domains include in-plane ($q_{xy}$) (100) peaks and out-of-plane ($q_z$) (010) peaks
[c](001) peaks do not distinguish between an edge-on or face-on orientation In the out-of-plane ($q_z$) cuts, all three polymers show significant edge-on lamellar ordering with (100), (200), (300) and even (400) peaks clearly visible. The d-spacing and CCLs for these edge-on lamellar do-mains are all similar as well; indicating there is comparative side-chain based ordering in these three polymers. Additionally INDT BT demonstrates a clear out-of-plane π-π stacking (010) peak, indicating it also has face-ons π-π stacking crystallites, in contrast to the other two polymers. The in-plane ($q_{xy}$) line cuts for all three polymers exhibit edge-on (010) peaks, however there is a demonstrative reduction in peak intensity in the progression INDT-BT to INDT S to INDT-T. Additionally, all three polymers show some indication of face-on (100) domains, however there is a great reduction in intensity and CCL of this domains on going from INDT-BT to INDT S to INDT-T as shown in Table 8. It appears that INDT-BT shows some balance between edge-on and face-on domains while INDT-S and INDT-T greatly favor the edge-on orientation. Crucially, there is a significant difference in the polymer (001) and (002) peaks, which correspond to planes resulting from repeat polymer units in an ordered chain backbone (FIG. 8). These peaks indicate the relative degree to which the polymer is forming straight chains in the film, a highly beneficial quality for charge transport. The (001) peak d-spacings are in good accordance with the geometry-optimized size of a repeat unit. The large CCL in all three polymers, but especially in INDT-BT indicates strong straight chain ordering. The CCL of 23 nm for INDT-BT corresponds to 13 repeat units, a remarkable level of straight chain ordering for a polymer of this design. INDT-BT exhibits a sharp (001) peak and a sharp (002) second order reflection while INDT-S exhibits a clear (001) peak and a broad, but clear second order reflection. INDT-T exhibits a (001) peak but no second order reflection indicating that while it does have strong periodicity along the chain backbone, including a Scherrer analysis-derived CCL slightly higher than INDT S, the lack of a (002) indicates the ordering is not as strong as in the other two polymers.

We believe the highly ordered straight chain backbone properties of INDT-BT are the source of its ultra-high electron transport properties. These results correlate with similar findings for high p-type mobility conjugated polymers and demonstrate how high polymer backbone coplanarity is crucial for high charge transport. It is important to discuss the implications of these results in the greater context of conjugated polymer design. Typically, introduction of selenophene or benzothiadiazole moieties into a conjugated polymer backbone has been a successful strategy to enhance charge transporting characteristics, in particular n-type mobility. The increase in n type mobility is usually attributed to the lowering of the LUMO which facilitates charge injection. However, in our case we find that there is very little difference in measured LUMO energy between the T, S, and BT containing conjugated polymers, yet we still see significantly enhanced n-type charge transport, due to the increased crystallinity along the polymer backbone. The fact that we are not modifying the INDT monomer unit, but only changing the co-monomer from T to S to BT means that the increase in backbone crystallinity must originate solely from this modification. This suggests that both benzothiadiazole and selenophene (the former more than the latter) may have an inherent ability to induce order along the polymer backbone. Therefore it is possible that the increase in mobility that is commonly observed when introducing either S or BT units is not solely due to electronic effects on the LUMO but also to a subtle increase in order along the polymer backbone. Whether this increased backbone crystallinity is a result of an intra-molecular rigidification of the backbone structure50 or increased intermolecular stacking interactions7 is unclear and is the subject of ongoing investigations. However, the suggestion that a benzothiadiazole unit in a conjugated polymer chain results in a more linear, rigid backbone, thus allowing for efficient charge transport may begin to explain why this heterocyclic unit has consistently been present in the highest performing polymers for organic electronics. Conventionally structured OPV devices were fabricated using the present polymers and PC71BM, spin-coated from a 4:1 $CHCl_3$:ODCB solution (10 mg/mL).

Figure 9A:
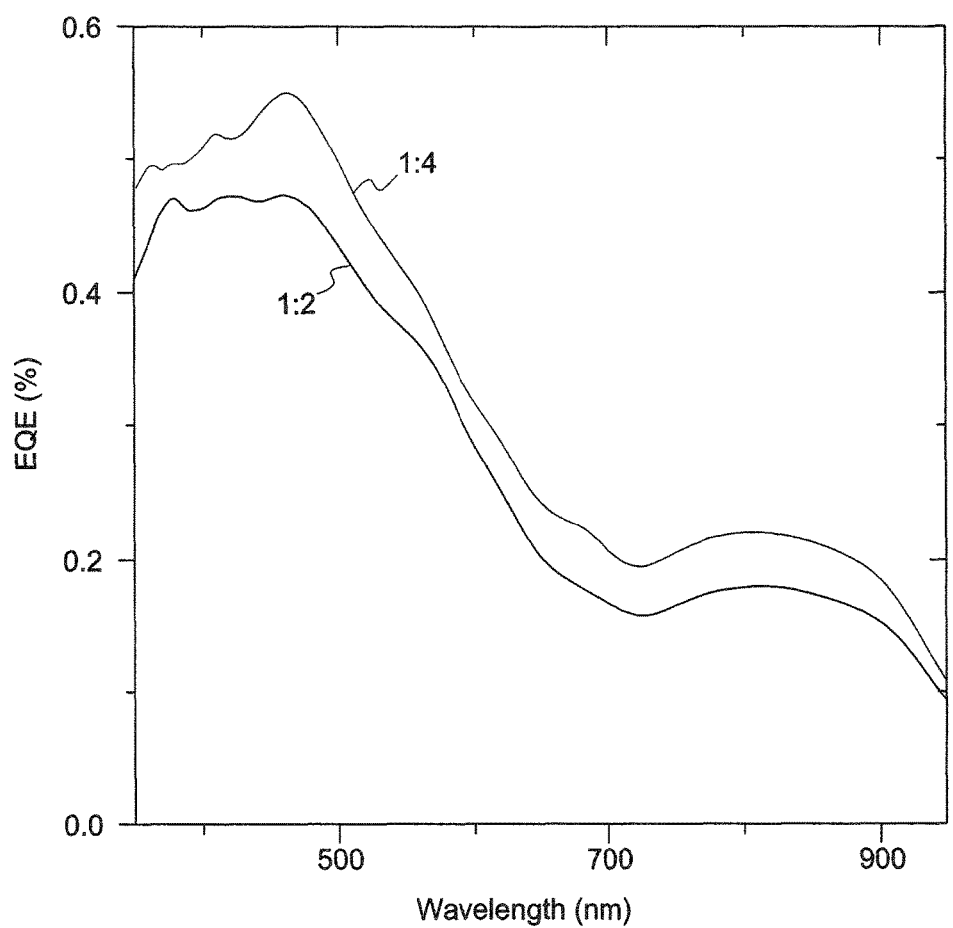
FIG. 9A is a graph showing EQEs of solar cells of INDT-T.
Figure 9B:
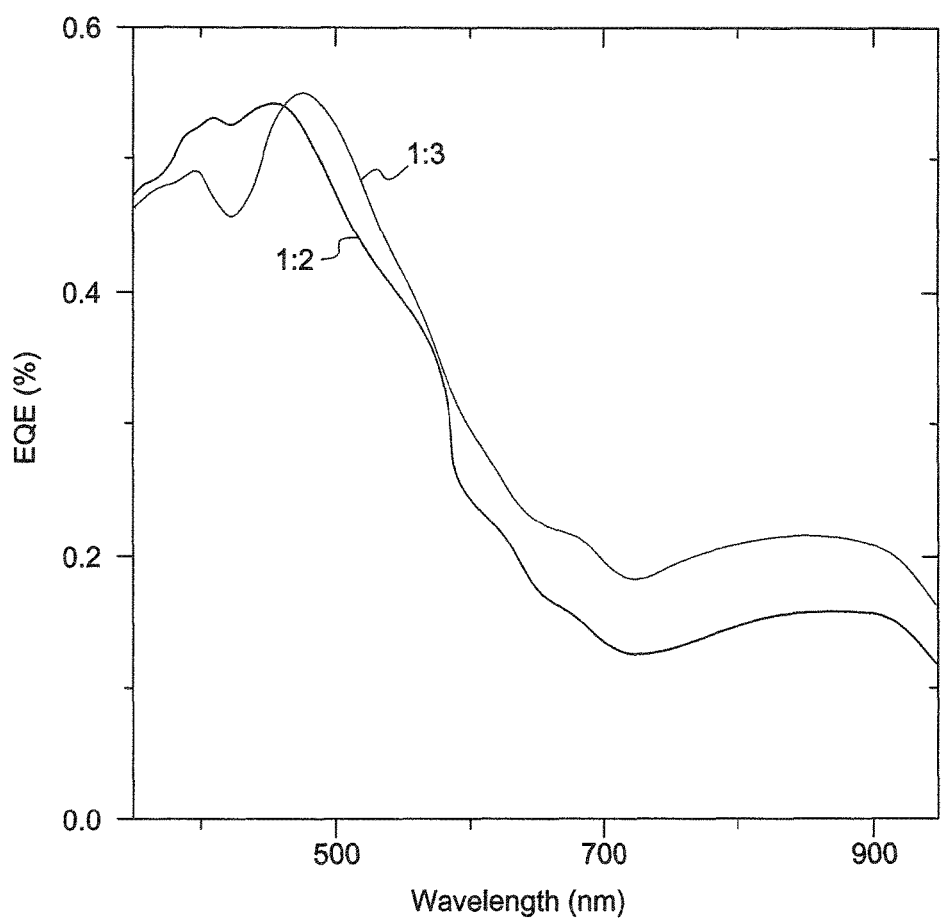
FIG. 9B is a graph showing EQEs of solar cells of INDT-S with varying polymer:PC$_{71}$BM blends.

J-V plots are shown in FIG. 9 of Appendix 2, the entire contents of which are hereby incorporated by reference, and device data are tabulated in Table 9.

TABLE 9

OPV Device Characteristics of INDT-Based Solar Cells

| Polymer | $V_{OC}$ (V) | $J_{sc}$ (mA cm$^{-2}$) | FF | PCE (%) |
|---|---|---|---|---|
| INDT-T | 0.60 | 9.1 | 0.64 | 3.5 |
| INDT-S | 0.56 | 8.9 | 0.61 | 3.1 |
| INDT-P | 0.69 | 6.0 | 0.43 | 1.8 |
| INDT-BT | 0.57 | 4.4 | 0.53 | 1.31 |

We previously reported the maximum efficiency of INDT-T in a conventionally structured OPV device to be 2.3%; Using the higher molecule weight material, the open circuit voltage (VOC) was measured to be 0.6 V, with significant improvements to the short circuit current (JSC) and the fill factor (FF), resulting in an overall device efficiency of 3.5%. The increase is likely due to the increased molecular weight resulting in an improved bulk hetero-junction (BHJ) morphology. INDT-S devices have a lower VOC, in line with the raised HOMO observed experimentally, and an overall device efficiency of 3.1%. The reasonably high FFs for both INDT-T and INDT-S indicate that both materials are performing correctly in the BHJ devices.

Although the efficiency of the devices are modest it should be noted that these are some of the highest values reported for materials with such narrow band-gaps.51 INDT-P has a significantly larger Voc, again in agreement with the deeper HOMO caused by the twisting of the phenyl group in the polymer backbone, however the FF and Jsc are both low. INDT-P is relatively insoluble in chlorobenzene and obtaining good quality films was not possible. Thus it is not possible to determine whether the reduced performance is due to electronic or morphological factors. Finally, INDT-BT did not perform well in OPV devices in part due to reduced performance in all three figures of merit, especially JSC. The lower VOC is likely contributed by the higher HOMO in INDT-BT reducing the cross-gap with the fullerene acceptor. The reduced FF and JSC are most likely products of the high crystallinity that affords such high OFET mobilities, but in this case, the large crystalline domains suppress intermixing between the donor and acceptor phases, leading to reduced photocurrent generation.

The effect of varying fullerene blend ratio in INDT-T and INDT-S based OPV devices was investigated as both these materials show promise for near-IR based solar cells. The EQEs and resulting data are shown in FIGS. 10A-10B and Table 10.

TABLE 10

OPV Device Characteristics of INDT-T and INDT-S Solar Cells with Different Fullerene Blends

| Polymer | D:A$^a$ | $J_{sc}$ (mA cm$^{-2}$) | $V_{oc}$ (V) | FF | PCE (%) |
|---|---|---|---|---|---|
| INDT-T | 1:2 | 0.60 | 9.1 | 0.64 | 3.5 |
|  | 1:3 | 0.61 | 10.0 | 0.66 | 4.0 |
|  | 1:4 | 0.61 | 10.2 | 0.66 | 4.1 |
| INDT-S | 1:2 | 0.56 | 8.9 | 0.61 | 3.1 |
|  | 1:3 | 0.57 | 10.3 | 0.60 | 3.5 |

$^a$Ratio of polymer donor (D) to fullerene acceptor (A)

It can clearly be seen that for both INDT-T and INDT-S increasing the fullerene content leads to increased device performance. For both polymers, VOC and FF remain relatively constant on increasing fullerene concentration, but a significant increase in JSC is observed. For INDT-T, a champion device efficiency of 4.1% was obtained, whereas for INDT-S, although a similar JSC of ~10 mA cm-2 being obtained, the lower VOC led to slightly lower overall PCEs. The external quantum efficiencies (EQEs) of both polymer devices are of considerable interest. Although it is clear that the majority of the photocurrent originates from the fullerene absorption (~450 nm), there is a clear and significant contribution from the polymer absorption. Remarkably, as the fullerene concentration is increased, it can clearly be seen that the increasing photocurrent is in part due to a greater contribution from the polymer absorption and EQE values in excess of 0.2 are observed at wavelengths up to 900 nm. Considering the ultra-low band-gaps of these polymers and relatively large VOC of the OPV devices, the fact that relatively efficient charge photogeneration is observed at all is remarkable. It can be expected that the driving force for charge separation (ΔGCS) is very low and indeed, taking the most commonly quoted electron affinity of PC71BM, 3.7 eV, the LUMO levels of the donor and acceptor are almost isoenergetic, implying virtually zero AGCS. Despite this, all contribution to the photocurrent above 700 nm results from a distinct contribution from polymer absorption.

To investigate this, femtosecond transient absorption spectroscopy (TAS) was performed on INDT-S:PC71BM (1:4) blend films as a representative case (the respective INDT-T blend produced identical spectral trends). TAS results of pristine INDT-S (Appendix 2 FIG. 11a), pumped at the polymer absorption band at 800 nm, reveal a broad band at approximately 1500 nm that decays with a time constant of 23 ps, and is assigned to the polymer singlet exciton. Addition of the PC71BM to create the 1:4 blend film also leads to the formation of the polymer singlet exciton (Appendix 2 FIG. 11b). However, after the singlet exciton has decayed, a much longer-lived component is observed that absorbs from 1060 nm to above 1400 nm. This component is still present when the INDT-S:PC71BM blend transient spectrum is measured on ns-s timescales (Appendix 2 FIG. 11b inset). Since no $O_2$ sensitivity is observed, this long-lived component is assigned to polymer polarons.

The kinetics for both the pristine and blend films are shown in FIG. 12c, using a pump wavelength of 800 nm, thereby selectively exciting solely the polymer. It can be observed that the singlet exciton decay is largely complete by approximately 100 ps, leaving a signal of close to zero for the pristine film. For the blend film however, the long-lived polymer polarons are evident after 100 ps and they comprise approximately 17% of the initial signal amplitude. As such, most of the polymer excitons formed are lost through relaxation back to the ground state (83%), which can be largely attributed to the lack of driving force for charge separation, although nanomorphology may also play a role. This is consistent with the polymer contribution to the EQE of approximately 20% at 800 nm. Nevertheless, it is remarkable that such a high proportion of charge carriers are achievable through polymer excitation in ultra-low band gap polymers.

Observations when the fullerene is excited at 490 nm are quite different (FIG. 11d) and suggest the presence of a second charge photogeneration mechanism. Upon excitation of the INDT-S:PC71BM blend at 490 nm, no decay is observed at all. Instead, two separate rises in the ground state bleach signal are observed: the first from the initial time delay until approximately 100 ps, and the second from 100 ps until the end of the measured time range. These rises correspond to a steadily increasing concentration of polymer polarons in the blend film. The timescale of the second rise is consistent with hole transfer from the photoexcited fullerene to the polymer. This unusually slow nanosecond timescale hole transfer process has been previously observed in other polymers with low-lying LUMO levels.52 Since the appearance of this second rise coincides with the completion of the polymer exciton decay, the first rise for the INDT S:PC71BM blend can therefore be assigned to a combination of polymer exciton decay and hole transfer rise. The result of the slow rise in the polymer polaron concentration at this excitation wavelength is that by the end of the measured time range the percentage of polymer polarons present is approximately double that of solely polymer excitation when the polaron signals are normalised for number of photons absorbed. Again, this is consistent with the EQE results, which show a much greater contribution from PC71BM excitons compared to polymer excitons.

We report a family of four extremely narrow band-gap polymers based on naturally occurring indigo with high thin-film crystallinity resulting in ultra-high n-type charge transport in OFETs. Electron mobility over 3 cm2 Vs−1 was observed in benzothiadiazole copolymers, arising from a highly ordered polymer backbone. The extent of backbone crystallinity varied significantly as determined by GIWAXS and could be correlated with the electron mobility of the conjugated polymer. OPV devices using the novel materials gave PCEs up to 4.1% in OPVs with demonstrable photocurrent generation occurring at wavelengths up to 1000 nm, while retaining good open circuit voltages. These results demonstrate the potential of this relatively unexplored chromophore in organic semiconductors as both an n-type transistor and a near IR absorber in next generation organic electronic devices. Perhaps more importantly, these novel materials have allowed for a detailed understanding of the molecular origin of high n-type mobility in conjugated polymers. We anticipate the structure/optoelectronic relationships reported herein will contribute strongly to the bottom-up design of high mobility organic semiconductors.

Described below are exemplary methods to produce the organic semiconductor polymers. 1H NMR spectra were recorded at 400 MHz on a Bruker Avance 400 spectrometer, at 500 MHz on a Bruker Avance 500 spectrometer, or at 600 MHz on a Bruker Avance 600 spectrometer in the stated solvent using residual protic solvent CHCl3 (δ=7.26 ppm, s) or DMSO (δ=2.56 ppm, qn) as the internal standard. 13C NMR spectra were recorded at 125 MHz on a Bruker Avance 500 spectrometer or at 150 MHz on a Bruker Avance 600 spectrometer in the stated solvent using the central reference of CHCl3 (δ=77.0 ppm, t) or DMSO (δ=39.52 ppm, septet) as the internal standard. Mass spectra were obtained using either a VG70-SE or MAT 900XP spectrometer at the Department of Chemistry, University College London. X-ray diffraction (XRD) measurements were carried out with a Bruker D4 Endeavor diffractometer equipped with a nickel-filtered Cu Kα1 beam and a scintillation counter detector and postsample graphite monochromator, using a current of 30 mA and an accelerating voltage of 40 kV. UV-vis spectra were recorded on a PerkinElmer Lambda 950 spectrophotometer.

Example 1

Synthesis of 2-Nitro-5-((tetrahydro-2H-pyran-2-yl) oxy)-benzaldehyde. 5-Hydroxy-2-nitrobenzaldehyde (5.09 g, 31 mmol) and 3,4-dihydro-2H-pyran (13.7 mL, 0.15 mol) were dissolved in a 4:1 solution of dichloromethane:hexane (61 mL). p-Toluenesulfonic acid (58 mg, 1 mol %) was suspended in dichloromethane (15 mL), and a few drops of pyridine were added. The acidic mixture was then added in one portion, and the reaction was stirred for 12 h. Solvent and unreacted 3,4-dihydro-2H-pyran were then removed in vacuo to give a brown oil which was purified by flash chromatography on silica gel (4:1, PET:EtOAc, RF=0.3) to give the product as a yellow oil (7.66 g, 100%). 1H NMR (400 MHz, CDCl3) δ: 10.49 (s, 1H), 8.17 (d, J=9.0 Hz, 1H), 7.51 (d, J=2.8 Hz, 1H), 7.33 (dd, J=9.0, 2.8 Hz, 1H), 5.62 (t, J=2.8 Hz, 1H), 3.84-3.74 (m, 1H), 3.71-3.63 (m, 1H), 1.96-1.90 (m, 2H), 1.80-1.69 (m, 2H), 1.68-1.62 (m, 2H). LRMS (CI+) m/z 252 [MH]+.

Example 2

Synthesis of (E)-5,5'-Bis(benzyloxy)[2,2'-biindolinylidene]-3,3'-dione. 2-Nitro-5-((tetrahydro-2H-pyran-2-yl)oxy)benzaldehyde (2.3 g) was dissolved in acetone (34.5 mL) and cooled to −10° C. With vigorous stirring, a 0.2 M solution of potassium hydroxide (4.6 mL) was added dropwise over 15 min, turning the solution pale yellow. After 30 min the solution was warmed to 5° C., and a 0.4 M solution of potassium hydroxide (34.5 mL) was added dropwise slowly. When half of this solution was added, the reaction turned deep green; once addition was complete, the reaction was a dark green/blue color. After addition, the reaction was covered and allowed to warm to room temperature and stirred for 24 h. The solid was then collected by vacuum filtration and washed with methanol until washings ran colorless to give a blue solid (0.72 g, 34%). 1H NMR (600 MHz, CDCl3) δ: 8.76 (s, 2H), 7.42 (d, J=2.5 Hz, 2H), 7.22 (dd, J=8.7, 2.5 Hz, 2H), 6.96 (d, J=8.7 Hz, 2H), 5.34 (t, J=3.3 Hz, 2H), 3.97-3.88 (m, 2H), 3.68-3.58 (m, 2H), 2.04-1.94 (m, 4H), 1.92-1.82 (m, 4H), 1.73-1.63 (m, 4H). LRMS (CI+): m/z 463 [MH]+. HRMS Found (CI+): [MH]+463.18632; C26H27N2O6 requires 463.18691.

Example 3

Synthesis of 2,9-Dihydroxy-7,14-di(thiophen-2-yl) diindolo[3,2,1-de:3',2',1'-ij]-[1,5]naphthyridine-6,13-dione (E)-5,5'-Bis((tetrahydro-2H-pyran-2-yl)oxy)-[2,2'-biindolinylidene]-3,3'-dione (2.2 g, 4.8 mmol), and 2-(thiophen-2-yl)acetyl chloride (3.6 mL, 29 mmol) were dissolved in anhydrous xylene (96 mL), and the reaction refluxed at 165° C. for 24 h. The blue reaction turned purple after 1 h. After 24 h the vapors from the argon flow were no longer acidic. The reaction was transferred to a 250 mL round-bottomed flask washing with methanol and chloroform. All solvent was removed in vacuo to give a black residue. The residue was taken up in methanol, and the yellow methanol washings carefully decanted off, to leave the black solid in the flask. After five methanol washings the solid was suspended in methanol, and with stirring, 5% sodium hydroxide solution (20 mL, 2.5 equiv) was added. The solution immediately turned dark red and then black and allowed to stir for 12 h. 6 M hydrochloric acid (4.1 mL, 24.8 mmol) was then added to neutralize the reaction. The methanol and water were then removed in vacuo, and the resulting residue was washed with a small amount of water which was carefully decanted off to remove any salts. The solid was then taken up in acetone and filtered off under reduced pressure. The resulting dark solid was washed with water, acetone, and then methanol and air-dried to give a black solid (0.7 g, 29%). 1H NMR (600 MHz, DMSO) δ: 10.03 (s, 2H), 8.22 (d, J=8.7 Hz, 2H), 7.96 (d, J=4.5 Hz, 2H), 7.74 (d, J=3.6 Hz, 2H), 7.53 (d, J=2.4 Hz, 2H), 7.35 (dd, J=4.5, 3.6 Hz, 2H), 7.07 (dd, J=8.7, 2.4 Hz, 2H). LRMS (ES+) m/z 507 [MH]+. HRMS Found (ES+): [MH]+507.0482; C28H15N2O4S2 requires 507.0473.

Example 4

Synthesis of 2,9-Dihydroxy-7,14-di(thiophen-2-yl)diindolo[3,2,1-de:3',2',1'-ij]-[1,5]naphthyridine-6,13-dione 2,9-Dihydroxy-7,14-di-(thiophen-2-yl)diindolo[3,2,1-de:3',2',1'-ij][1,5]naphthyridine-6,13-dione (0.7 g, 1.4 mmol), potassium carbonate (2.67 g, 19 mmol), and 9-(bromomethyl)nonadecane (1.25 g, 3.5 mmol) were dissolved in dimethylformamide (28 mL) and heated at 60° C. with stirring for 24 h. The reaction was then cooled and poured into a separating funnel containing brine and hexane. The organic layer was extracted with brine (5×50 mL), separated, and filtered under reduced pressure to remove black particulates. The purple organic filtrate was then dried over magnesium sulfate, filtered, and concentrated in vacuo to give a purple oil. The crude oil was purified by flash chromatography on silica gel (9:1, PET:EtOAc, RF=0.2) to give a pure purple oil (119 mg, 8%). 1H NMR (600 MHz, CDCl3) δ: 8.40 (d, J=8.9 Hz, 2H), 7.74 (dd, J=3.6, 0.8 Hz, 2H), 7.69 (dd, J=5.1, 0.8 Hz, 2H), 7.65 (d, J=2.5 Hz, 2H), 7.27-7.24 (m, 2H), 7.08 (dd, J=8.9, 2.5 Hz, 2H), 3.81 (d, J=5.8 Hz, 4H), 1.81-1.73 (m, 2H), 1.47-1.40 (m, 4H), 1.40-1.35 (m, 4H), 1.35-1.20 (m, 56H), 0.90-0.84 (m, 12H). 13C NMR (150 MHz, CDCl3) δ: 158.5, 158.0, 138.0, 134.8, 130.3, 130.2, 130.1, 127.1, 126.3, 125.1, 122.5, 118.4, 118.3, 111.0, 71.9, 38.0, 32.0, 31.4, 30.2, 29.8, 29.7, 29.5, 26.9, 22.8, 14.3. LRMS (ES−) m/z 1065 [M-H]+.

Example 5

Synthesis of 7,14-Bis(5-bromothiophen-2-yl)-2,9-bis((2-octyldodecyl)oxy)diindolo[3,2,1-de:3',2',1'-ij][1,5]naphthyridine-6,13-dione 2,9-Bis-((2-octyldodecyl)oxy)-7,14-di(thiophen-2-yl)diindolo[3,2,1-de:3',2',1'-ij][1,5]naphthyridine-6,13-dione (119 mg, 0.11 mmol) was dissolved in dichloromethane (15 mL), and the solution was cooled to 0° C. N-Bromosuccinimide (43 mg, 0.24 mmol) was added all at once to the stirring solution, and the reaction was covered and kept at 0° C. for 30 min. The ice bath was then removed, and the reaction was allowed to warm to room temperature and stir for a further 12 h. After 1 h the solution had changed from purple to sapphire blue. After 12 h, the reaction was diluted with further dichloromethane, washed with water (2×30 mL) and then brine (30 mL), dried over magnesium sulfate, and concentrated to give a waxy solid. Methanol was added to the flask and to give a suspension, which was then collected by vacuum filtration to give a pure blue waxy solid (60 mg, 44%). 1H NMR (600 MHz, CDCl3) δ: 8.34 (d, J=8.9 Hz, 2H), 7.67 (d, J=2.4 Hz, 2H), 7.54 (d, J=3.9 Hz, 2H), 7.21 (d, J=3.9 Hz, 2H), 7.07 (dd, J=8.9, 2.4 Hz, 2H), 3.83 (d, J=5.7 Hz, 4H), 1.83-1.75 (m, 2H), 1.48-1.41 (m, 4H), 1.41-1.36 (m, 4H), 1.36-1.17 (m, 56H), 0.91-0.83 (m, 12H). 13C NMR (150 MHz, CDCl3) δ: 158.1, 137.6, 136.6, 123.0, 129.2, 129.0, 126.8, 124.4, 122.4, 118.7, 111.0, 72.0, 51.0, 38.0, 32.0, 31.4, 30.2, 29.8, 29.5, 27.0, 22.8, 14.3. HRMS Found (ES−): [M-H]−1221.4817; $C_{68}H_{91}Br_2N_2O_4S_2$ requires 1221.4787.

Example 6

Synthesis of Polymer INDT-T. 7,14-Bis(5-bromothiophen-2-yl)-2,9-bis((2octyldodecyl)oxy)diindolo[3,2,1-de:3',2',1'-ij]

[1,5]naphthyridine-6,13-dione (60.1 mg, 49.1 μmol), tris(dibenzylideneacetone)dipalladium(0) (2.6 mg, 2.8 μmol, 6 mol %), tri(o-tolyl)phosphine (3.47 mg, 11.4 μmop, and 2,5-bis(trimethylstannyl)thiophene (20.15 mg, 49.1 μmol) were added to a dry 10 mL microwave vial equipped with a stirrer bar and sealed. Chlorobenzene (2.5 mL) was added via syringe, and the solution was degassed with argon for 30 min. The vial was then placed in a microwave reactor and heated as follows: 10 min at 100° C., 5 min at 120° C., 5 min at 140° C., 5 min at 160° C., and 20 min at 180° C. The vial was then allowed to cool, and the reaction had changed color from sapphire blue to turquoise. The reaction mixture was added dropwise slowly into rapidly stirring methanol (70 mL) and allowed to stir for 2 h, forming fine dark blue fibers. The polymeric material was then filtered under reduced pressure into a cellulose thimble and washed with methanol and then acetone. The polymer was purified by Soxhlet extraction as follows: acetone for 12 h, hexane for 12 h, and Chloroform for 12 h. The chloroform was then concentrated to give a turquoise plastic-like film on the round-bottomed flask. This film was dissolved in a minimum volume of hot chlorobenzene (~2.5 mL) and then added dropwise slowly into rapidly stirring methanol cooled to 0° C. Once addition was complete, the methanol was stirred for 30 min, filtered under vacuum, washed carefully with methanol and then a small amount of acetone, then allowed to dry, forming a dark blue film. The polymer was air-dried for 1 h, placed in a vial, and dried under vacuum for 12 h (49 mg, 87%). GPC (PS): Mn=15687, Mw=49381, PDI=3.15. UV (PhCl) λmax 797, (thin film) λmax 790.

It is to be understood that the present invention is not limited to the embodiments described above, but encompasses any and all embodiments within the scope of the following claims.

We claim:

1. An organic semiconductor polymer, comprising a conjugated polymer having the formula:

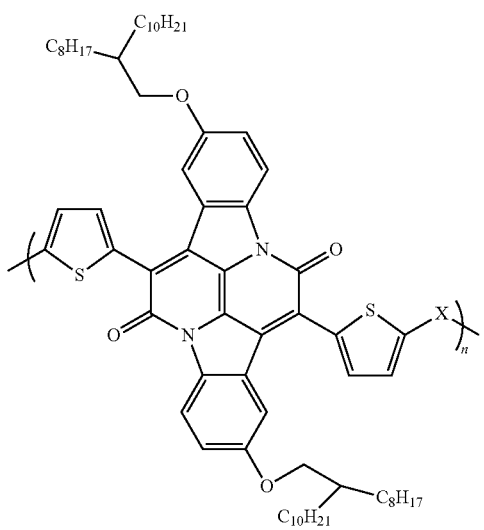
wherein X is thiophene, phenyl, selenophene, or benzothiadazole.
2. A semiconductor, comprising an organic semiconductor polymer according to claim 1.
3. An organic semiconductor polymer, comprising a conjugated polymer having the formula:
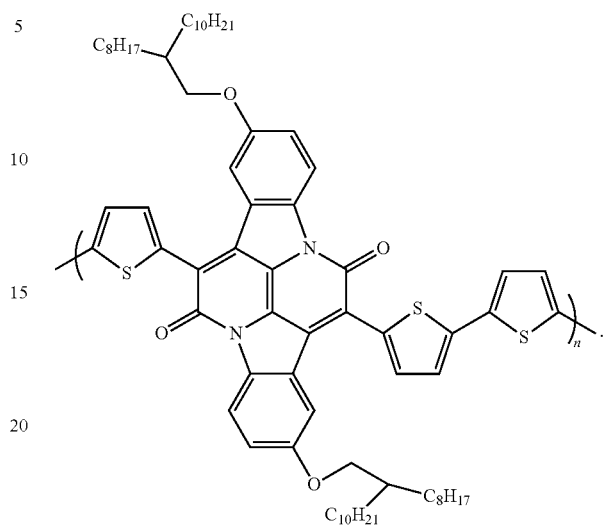
* * * * *